United States Patent [19]

Yamamoto et al.

[11] Patent Number: 5,600,245
[45] Date of Patent: Feb. 4, 1997

[54] INSPECTION APPARATUS USING MAGNETIC RESONANCE

[75] Inventors: Etsuji Yamamoto, Akishima; Hisaaki Ochi, Kodaira; Hiroyuki Itagaki, Kokubunji; Yukari Onodera, Asaka; Hiroyuki Takeuchi, Kashiwa, all of Japan

[73] Assignees: Hitachi, Ltd.; Hitachi Medical Corporation, both of Tokyo, Japan

[21] Appl. No.: 319,724

[22] Filed: Oct. 7, 1994

[30] Foreign Application Priority Data

Oct. 8, 1993 [JP] Japan .................................. 5-252820
Dec. 27, 1993 [JP] Japan .................................. 5-330515

[51] Int. Cl.$^6$ ............................................. G01V 3/00
[52] U.S. Cl. .................................. 324/318; 324/319
[58] Field of Search ............................. 324/318, 319, 324/322, 307, 309; 128/653.5

[56] References Cited

U.S. PATENT DOCUMENTS

| | | | |
|---|---|---|---|
| 5,311,134 | 5/1994 | Yamagata et al. | 324/318 |
| 5,337,001 | 8/1994 | McDougall et al. | 324/318 |
| 5,372,137 | 12/1994 | Wong et al. | 324/318 |
| 5,399,969 | 3/1995 | Bernstein | 324/309 |

*Primary Examiner*—Louis M. Arana
*Attorney, Agent, or Firm*—Antonelli, Terry, Stout & Kraus, LLP

[57] ABSTRACT

An inspection apparatus using magnetic resonance includes magnetic field generators for generating a static magnetic field, a gradient magnetic field and a radio frequency magnetic field, respectively, a signal detector for detecting magnetic resonance signals from an inspected object, a computer for executing arithmetic operations for detection signals from the signal detector and an output device of the result of the arithmetic operations by the computer. The gradient magnetic field generator includes first and second gradient coils, the first gradient coil is a coil fixed to a magnet for generating a static magnetic field, the second gradient coil is a movable coil, and the magnetic field generated by the second gradient coil at a conducting portion of the magnet is offset by the magnetic field generated by the first gradient coil. According to this construction, an eddy current that occurs with the time change of the gradient magnetic field can be reduced.

33 Claims, 19 Drawing Sheets

INSPECTION APPARATUS USING MAGNETIC RESONANCE

BACKGROUND OF THE INVENTION

This invention relates to an inspection apparatus using magnetic resonance (hereinafter referred to as the "MRI apparatus"). More particularly, it relates to the construction of a gradient coil for reducing an eddy current that occurs with the change of a gradient magnetic field with time, and to an RF probe.

X-ray CT and ultrasonic diagnostic apparatuses have been widely utilized in the past as apparatuses for non-destructively inspecting the internal structure of the human body. Further, it has become possible in recent years to conduct similar inspections by using a magnetic resonance phenomenon and to acquire those data which cannot be obtained by X-ray CT and the ultrasonic diagnostic apparatuses.

MRI is an imaging diagnostic method utilizing the phenomenon that an atomic nucleus of a hydrogen atom or the like in an inspected object placed inside a static magnetic field resonates with a radio frequency (RF) magnetic field having a specific frequency proportional to the intensity of the static magnetic field. This is the method which can obtain an arbitrary tomogram of the human body and can also provide data on a blood flow and biological functions such as metabolism. Further, brain function imaging utilizing the increase of the blood flow quantity and the difference of magnetical properties of hemoglobins in the blood has been started recently, and studies on the brain functions have made a new turn.

In the apparatuses utilizing the magnetic resonance, signals from the inspected object must be separated and discriminated. One of the known methods for this purpose comprises applying a gradient magnetic field to the inspected object, making the static magnetic field applied to each part of the inspected object different from that of others and acquiring position data, for example. The fundamental principle of the apparatuses of this kind is described in "Journal of Magnetic Resonance", Vol. 18, 1975, pp. 69.

Recently, attempts have been made to measure the dynamic motion of the heart and activated regions of the brain by a ultra-high speed imaging method such as an echo-planar method by using such an apparatus. In the ultra-high speed imaging method, a method which uses an exclusive small gradient coil for generating a gradient magnetic field in the proximity of the inspected object has been proposed on the basis of the fact that it is primarily the head or the heart which is to be inspected (JP-A-1-227747).

In conjunction with the eddy current, too, it is known that the generation quantity of the eddy current can be restricted by reducing the size of the gradient coil and thus increasing the distance between this coil and a conducting portion of a magnet for generating the static magnetic field as static magnetic field generation means.

However, it is difficult to completely eliminate the eddy current by such a technology alone, and the eddy current must be further reduced. One of the effective methods is the one that uses a self-shielded coil. This method disposes a correction coil for generating an additional magnetic field having an opposite polarity in addition to a main coil for generating a main gradient magnetic field so that the magnetic field generated by the gradient coil can be reduced to a substantially negligible level at the conducting portion of the magnet. For, if the magnetic field is not generated at the conducting portion, the eddy current is not generated, either.

FIGS. 3 and 4 of the accompanying drawings are sectional views each showing the arrangement of the coil according to the prior art.

Next, an example of the prior art apparatuses will be explained with reference to FIG. 3. According to the prior art, a small gradient coil 220 is disposed inside a bore of a magnet 211 for generating the static magnetic field. A strong gradient magnetic field can be generated more easily by reducing the size of the gradient coil, but it is difficult to completely eliminate the eddy current. Therefore, the prior art technology adds a gradient coil 223 for correction outside a main gradient coil 221 so as to offset the eddy current and uses it as a unitary gradient coil. These gradient coils 221 and 223 are movable on a supporter 214 with a bed 213. However, because these coils are disposed close to each other, current-to-magnetic field transformation efficiency is low. Moreover, the bed 213 and the supporter 214 must be ruggedly produced so as to support the weight of the coils.

When a cross-section is imaged at a high speed of about dozens of mili-seconds to several seconds by the brain function imaging methods which have been actively made in recent years, a strong gradient magnetic field having quick rise and fall must be applied at a high speed to the inspected object. In other words, a large current having quick rise and fall must be caused to flow through the gradient coil and a power supply unavoidably becomes great in size.

Generally, the gradient coil imparts gradients to the homogeneous static magnetic field generated by the magnet, in two directions, that is, the direction of the static magnetic field and a direction orthogonally crossing the former, by using a plurality of coils. The coil for imparting the gradient in the direction of the static magnetic field is the one which is disposed in such a fashion that the direction of the magnetic field generated by it at the coil center lies in the direction of the static magnetic field (refer to "NMR Medicine", The Japanese Society of Magnetic Resonance in Medicine (Editor), Chapter 4, pp. 73–82, Maruzen (1991)). The direction of the magnetic field generated by the coil for imparting the gradient in the direction orthogonally crossing the direction of the static magnetic field, at the coil center, is different depending on the type of the magnet used.

In the MRI apparatus using a magnet (permanent magnet) for generating a homogeneous static magnetic field in the direction orthogonally crossing the axial direction of a cylinder of a cylindrical inside space for loading the human body, the coil for imparting a gradient of a magnetic field in the direction orthogonally crossing the direction of the static magnetic field is the one which is disposed in such a fashion that the direction of the magnetic field generated by it at the coil center lies in the direction of the static magnetic field, in the same way as the coil for imparting the gradient to the magnetic field in the direction of the static magnetic field (JP-A-64-64638).

On the other hand, in the MRI apparatus using a magnet (super-conducting magnet) for generating a homogeneous static magnetic field in the direction of the cylinder axis of the cylindrical inside space for loading the human body, the coil for imparting the gradient to the magnetic field in the direction orthogonally crossing the direction of the static magnetic field is the one which is disposed in such a fashion that the direction of the magnetic field generated by it at the coil center lies in a direction orthogonal to the direction of the static magnetic field, as typified by a saddle coil ("NMR Medicine", The Japanese Society of Magnetic Resonance in Medicine (Editor), Chapter 4, pp. 73–82, Maruzen (1991)). The gradient magnetic field generated by the gradient coil imparts three-dimensional position data to the MR image, and the spatial gradient of the magnetic field intensity must be linear in the imaging region.

Generally, the smaller the size of the coil, the smaller becomes power for driving the coil but at the same time, the linear region of the gradient magnetic field becomes smaller. For this reason, there is the limit to the reduction of power for driving the coil.

In contrast, a method is known which disposes a small local gradient coil, which is smaller than the main gradient coil, in the proximity of the inspected object in addition to the main gradient coil, and can execute high speed imaging without requiring a large scale power supply (JP-A-2-80031). This method is based on the principle that because the intensity at a certain point of the magnetic field generated by the current is inversely proportional to the square of the distance between the current and the certain point due to the Biot-Savart's law, smaller power is needed by disposing the coil closer to the object for imaging in order to generate a magnetic field having the same intensity.

When brain functional imaging is carried out using the local gradient coil according to the prior art in the MRI apparatus using a super-conducting magnet for generating the homogeneous static magnetic field in the direction of the cylinder axis of the cylindrical inside space for loading the human body, the positional relationship between the human body and the local gradient coil is such as shown in FIGS. 11A and 11B. FIG. 11A is a plan view when the local gradient coil is viewed from the front surface of the human body, and FIG. 11B is a front and perspective view when the local gradient coil is viewed from the human head. In the drawings, the direction of the static magnetic field lies in the z direction, and the direction of the body's axis is brought into conformity with the direction of the static magnetic field. The human body is loaded into a bobbin 16 for supporting the local gradient coil. An RF probe 14 for transmitting and receiving a radio frequency magnetic field to and from the human body may be of a type which executes both transmission and reception or of a type which executes transmission and reception by separate probes.

As shown in FIG. 12, coils 11 and 12 which impart the gradient to the magnetic field in the x and y directions as the directions orthogonally crossing the direction of the static magnetic field are disposed in such a manner that the direction of the magnetic fields generated by these coils at their centers lies in the direction orthogonal to the direction of the static magnetic field. In FIG. 11A, among the conducting wire constituting the coil 12 for imparting the gradient to the static magnetic field in the y direction, it is the conducting wire 12-1 positioned near the imaging area that generates a magnetic field effective for imparting the gradient to the static magnetic field, which lies in the z direction, in the y direction.

FIG. 13 is a perspective view showing only four coils 12 among a plurality of coils constituting the local gradient coil, which impart the gradient to the static magnetic field in the y direction. When a current 31 flows through the conducting wire 12-1 near the imaging area in the direction indicated by an arrow, a magnetic field 33 develops in a right hand screw direction in the flowing direction of the current around the conducting wire 12-1. When the magnetic fields 33 generated by the current 31 flowing through the four coils are combined in the imaging area, they become the sum 34 of the magnetic fields, and the gradient in the y direction is imparted to the static magnetic field in the z direction. Since the current flows through the conducting wire 12-2 spaced apart from the imaging area in the direction opposite to the conducting wire 12-1, a magnetic field 35 develops in such a manner as to offset the magnetic field generated by the conducting wire 12-1. This also holds true of the coil 11 for imparting the gradient in the x direction to the static magnetic field. It is the conducting wire 11-1 positioned near the imaging area that generates the magnetic field effective for imparting the gradient in the x direction to the static magnetic field in the z direction.

When the magnetic field crossing the conductor surface changes time-wise, an eddy current develops on the conductor surface in such a manner as to generate a magnetic field which inhibits such a change, according to the Faraday's law on electromagnetic induction. In the MRI apparatus, the magnet for generating the static magnetic field is made of the conductor. Generally, a cylindrical conductor shield is disposed inside the magnet. Therefore, the eddy current occurs on the conductor surface which is the nearest to the cylindrical inside space for loading the human body among the conducting portion of the magnet or on the cylindrical conductor shield at the rise and the fall of the gradient magnetic field.

FIG. 14A is a perspective view showing the cylindrical conductor shield 41, the y direction gradient coil 12 and a varying magnetic field 42 occurring at the rise of a gradient magnetic field according to the prior art example, and FIG. 14B is a perspective view showing the eddy current which is generated on the cylindrical conductor shield 41 by the varying magnetic field 42 occurring at the rise of the gradient magnetic field according to the prior art example. The direction of the varying magnetic field 42 generated by the coil 12 for imparting the gradient to the magnetic field in the y direction, at the rise of the gradient magnetic field lies in a direction orthogonally crossing the sheet surface of the cylindrical conductor shield 41. The direction of the magnetic field generated by the coil for imparting the gradient to the magnetic field in the x direction is the same, too. Accordingly, when the gradient magnetic field is switched at a high speed during high speed imaging, the eddy current 43 is generated on the cylindrical conductor shield 41 by the varying magnetic fields generated at the rise and the fall of the gradient magnetic field.

SUMMARY OF THE INVENTION

One of the features which is in common to conventional ultra-high speed imaging methods is that performance required for the gradient magnetic field is extremely high. As the performance values, the intensity of the gradient magnetic field of 20 to 40 mT/m and the rise time of about 250 μs are required. To accomplish these values by the conventional gradient coil, driving power in the order of 100 KW is necessary, and this renders a critical problem for practical application. Incidentally, the term "coil" herein used means a unitary structure comprising a winding and a bobbin for supporting the winding. Generally, power necessary for driving the gradient coil is proportional to the fifth power of the size of the coil winding. Therefore, it is extremely effective to reduce the size of the gradient coil in order to reduce driving power. A method which uses a self-shielded coil has been known in the past as an effective method of reducing the eddy current, but it is generally difficult to accomplish a self-shielded type small gradient coil. For, to reduce the size of the gradient coil, a correction coil for generating the magnetic field having an opposite polarity must be disposed extremely near the main coil for generating the original gradient magnetic field, and this invites the drop of efficiency of the generation of the gradient magnetic field.

Further, because both coils (main coil and correction coil) are disposed close to each other, machining accuracy required for the winding of the coil becomes unavoidably high. Further, a large current must be caused to flow in order to compensate for the drop of magnetic field generation efficiency, and mechanical strength of the coil bobbin and a support portion of the coil winding must be improved so as to cope with the force received from the static magnetic field generated by such a large current. This results in another problem that the weight of the coil increases, too.

Furthermore, there is a vicious cycle that the magnetic field generated by the eddy current generates an eddy current on the conductor and repeats secondary and tertiary radiation, and time constants range from dozens of mili-seconds to several seconds. The magnetic field generated by the eddy current disturbs the static magnetic field of the MRI apparatus and results in various artifacts. Accordingly, the reduction of the eddy current has been a very serious problem.

In the conventional local gradient coil shown in FIGS. 11A and 11B, the human shoulder 15 must be loaded into a bobbin 16 for supporting the local gradient coil. Therefore, even when the imaging part is only the head 17, it has been difficult to reduce the distance between the coil 11 for imparting the gradient to the magnetic field in the x direction and the center of the imaging part to the size below the half of the shoulder width. Though the coils 11 and 12 can be disposed above the shoulder by reducing the sizes of these coils 11, 12 for imparting the gradients in the x and y directions, another problem develops that the linear region of the gradient magnetic field generated by the coil becomes narrow.

To eliminate these problems with the prior art, it is an object of the present invention to provide an inspection apparatus using magnetic resonance, which is equipped with a gradient magnetic coil which can dispose a small gradient coil in the proximity of an inspected object without inviting the drop of gradient magnetic field generation efficiency, can impart a strong gradient magnetic field to the inspected object, and can also reduce an eddy current.

It is one of the features of the present invention that a gradient coil (correction gradient coil) for generating a magnetic field having an opposite polarity for self-shield is fixedly disposed on a magnet for generating a static magnetic field in the spaced-apart relation from a small main gradient coil.

In other words, gradient magnetic field generation means includes first and second two sets of gradient coils, the first gradient coil is a coil (correction gradient coil) arranged near and fixed to magnet directly or indirectly, for generating a static magnetic field, the second gradient coil is a movable coil (small main gradient coil), and the magnetic field generated by the second gradient coil at a conducting portion of the magnet for generating the static magnetic field is offset by the magnetic field generated by the first gradient coil.

The gradient magnetic field generated by the first gradient coil in the proximity of the center of the magnet is smaller than the gradient magnetic field generated by the second gradient coil, and the center of the gradient magnetic field generated by the first gradient coil is in conformity with the center of the gradient magnetic field generated by the second gradient coil. The second gradient coil is movable in the direction of the static magnetic field generated by the magnet.

A third gradient coil greater than the first and second gradient coils and fixed to the magnet for generating the static magnetic field are disposed in addition to the first and second gradient coils.

When the first, second and third gradient coils are driven, the first and second gradient coils are driven by the same current source, and the current source for driving the first and second gradient coils is the same as a current source for driving the third gradient coil with the exception that time constants of circuits for shaping the respective waveforms are different.

The third gradient coil is a self-shielded type gradient coil comprising two sets of coils. The first gradient coil is interposed between two sets of coils constituting the third gradient coil. At least one of the first and second gradient coils comprises a plurality of coils having mutually different shapes and these coils are so constituted as to substantially balance torques received from the static magnetic field.

In a nuclear magnetic resonance imaging apparatus including a magnet for generating a static magnetic field, a cylindrical inside space which is disposed inside the magnet and into which an inspected object is loaded, a gradient coil (third gradient coil) disposed inside the magnet and comprising a plurality of coils for generating a gradient magnetic field in the inside space, an RF probe for transmitting and receiving a radio frequency magnetic field to and from the inspected object and a movable local gradient coil (second gradient coil) disposed in the proximity of a local part of the inspected object for imaging the local part, generating a local gradient magnetic field and smaller than the gradient coil (third gradient coil), whereby the magnet generates the static magnetic field in an axial direction of the cylindrical inside space, the present invention has any of the following features.

(a) Among a plurality of coils that constitute the local gradient coil (second gradient coil), at least one of a plurality of coils generating the local gradient magnetic field in a direction other than the direction of the static magnetic field is disposed in such a fashion that the direction of the magnetic field generated by this coil at the coil center has an angle other than 90° with respect to the direction of the static magnetic field.

(b) A super-conducting magnet is used as the magnet described above, and among a plurality of coils that constitute the local gradient coil (second gradient coil), at least those coils which form a pair among a plurality of coils generating the local gradient magnetic field in a direction other than the direction of the static magnetic field are disposed in such a fashion that the direction of the magnetic field generated by these coils at their center has an angle other than 90° to the direction of the static magnetic field.

(c) A super-conducting magnet is used as the magnet, and among a plurality of coils that constitute the local gradient coils, at least those coils which form a pair among a plurality of coils generating the local gradient magnetic field in a direction other than the direction of the static magnetic field are disposed in such a fashion that the direction of the magnetic field generated by these coils at their center is in parallel with the direction of the static magnetic field.

(d) In the item (c), all of a plurality of coils which generate the local gradient magnetic field (second gradient coil) in the direction other than the direction of the static magnetic field are disposed in such a fashion that the direction of the magnetic field generated by these coils at their center is in parallel with the direction of the static magnetic field.

According to the features described above, the drop of gradient magnetic field generation efficiency can be prevented, both coils (main coil and correction coil) can be greatly spaced apart from each other, and machining accuracy required for the coil windings may be low. Further, because magnetic field generation efficiency is high, the current can be reduced, and the force received from the static magnetic field generated by such a current can be reduced, too. Accordingly, the mechanical strength of the coil bobbin and the supporter of the coil winding can be lowered, and the coil weight can be reduced, too.

According to the features described above, the conducting wire portion of the coil for generating the magnetic field effective for imparting the gradient to the static magnetic field can be brought close to the inspected part without limitation of the size of the human shoulder, and a strong gradient magnetic field can be imparted to the inspected part. Further, a gradient coil capable of reducing the eddy current can be thus constituted. In other words, the gradient coil can be so disposed as to avoid the human shoulder. Since the direction of the magnetic field generated by the gradient coil does not orthogonally cross the sheet surface of the cylindrical conductor shield, the magnetic field crossing the conductor surface becomes smaller than in the prior art apparatuses, and the eddy current occurring on the cylindrical conductor shield plate at the rise and fall of the gradient magnetic field can be reduced.

According to the construction of the present invention, the small self-shielded type gradient coil can be easily accomplished and the eddy current can be drastically reduced. Therefore, the present invention provide the effect that high image quality can be accomplished in ultra-high speed imaging of the head, or the like. Because the small main gradient coil is movable while the coil for correcting the eddy current is fixed, both coils can be disposed in the spaced-apart relation, current-to-magnetic field transformation efficiency can be improved, and the weight of the coils can be reduced. Machining accuracy required for the coil winding can be lowered, too. Because magnetic field generation efficiency becomes high, the current can be reduced, and the force received from the static magnetic field can be reduced, as well. Consequently, the mechanical strength of the coil bobbin can be reduced, and the weight of the coil can also be reduced. Further, when fine adjustment of the magnetic field is necessary so as to optimize homogeneity of the static magnetic field during ultra-high speed imaging of the heat, or the like, the magnetic field needs be optimized only in the inspected area unlike the case of imaging of the full body. Accordingly, higher homogeneity can be easily accomplished.

Furthermore, the conducting wire portion of the movable local gradient coil for generating the magnetic field effective for imparting the gradient to the static magnetic field can be brought close to the imaging part, power consumption required for driving the gradient coil may be smaller than in the conventional apparatuses. Because the eddy current occurring on the conducting portion of the magnet main body for generating the static magnetic field or on the cylindrical conductor shield plate can be reduced at the rise and fall of the gradient magnetic field, the artifacts resulting from the eddy current can be reduced.

DESCRIPTION OF THE PREFERRED EMBODIMENTS

Figure 1:
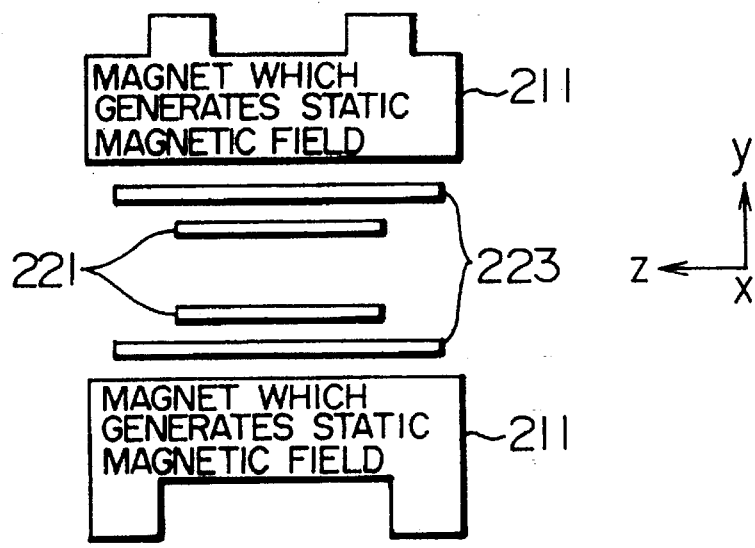
FIG. 1 is a sectional view showing the arrangement of a coil of the first embodiment of the present invention.
Figure 3:
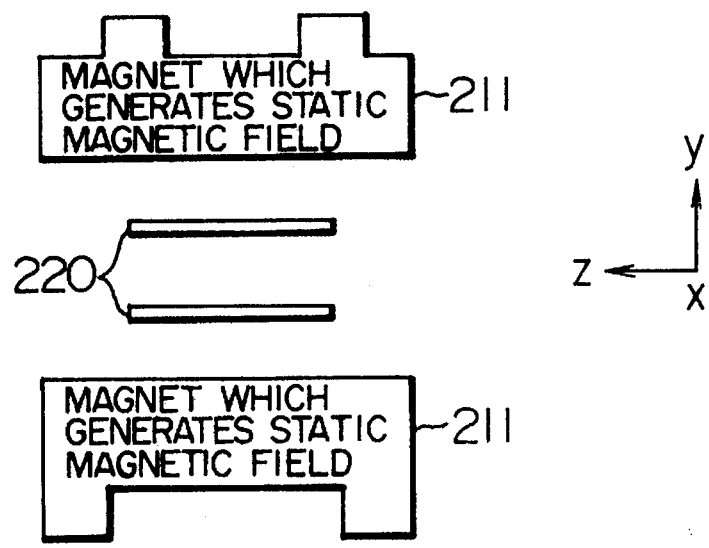
FIGS. 3 and 4 are sectional views each showing the arrangement of a coil according to the prior art.
Figure 2:
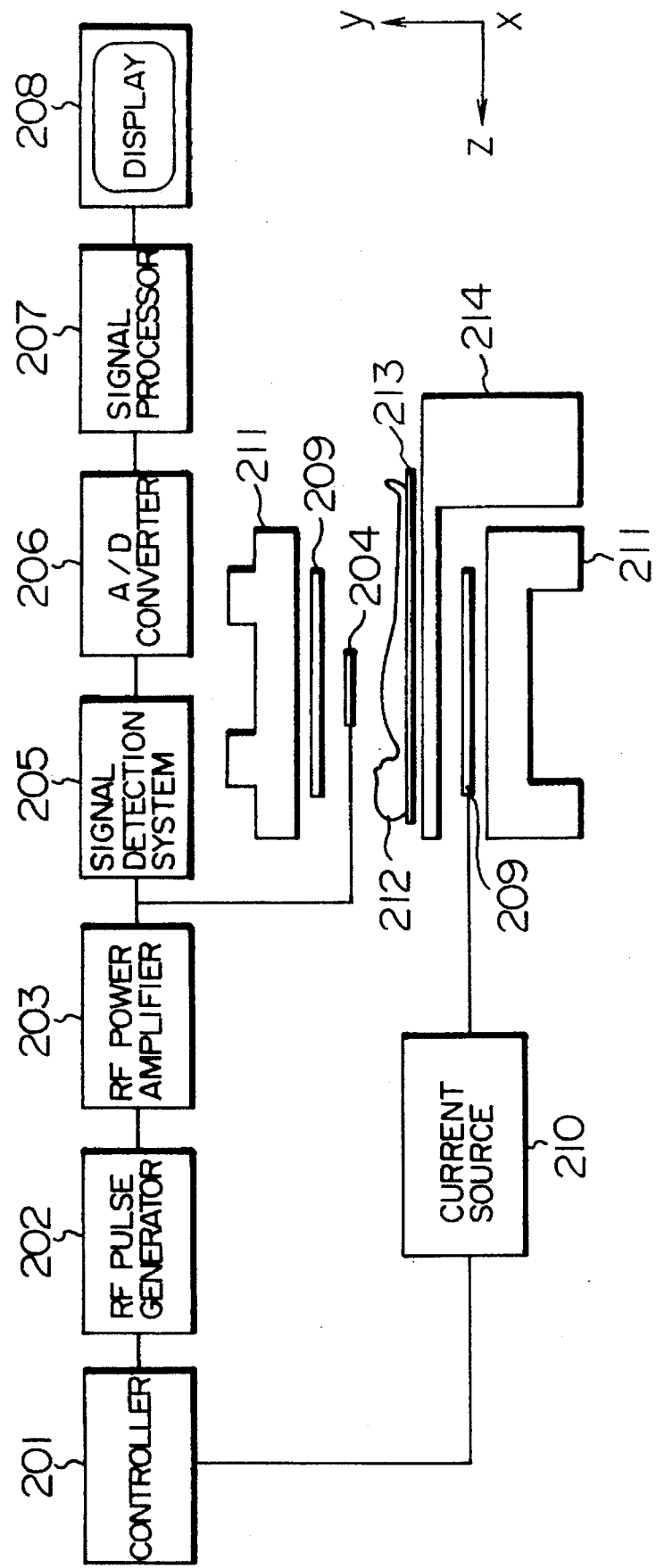
FIG. 2 is a block diagram showing an example of the construction of an MRI apparatus to which the present invention is applied.
Figure 4:
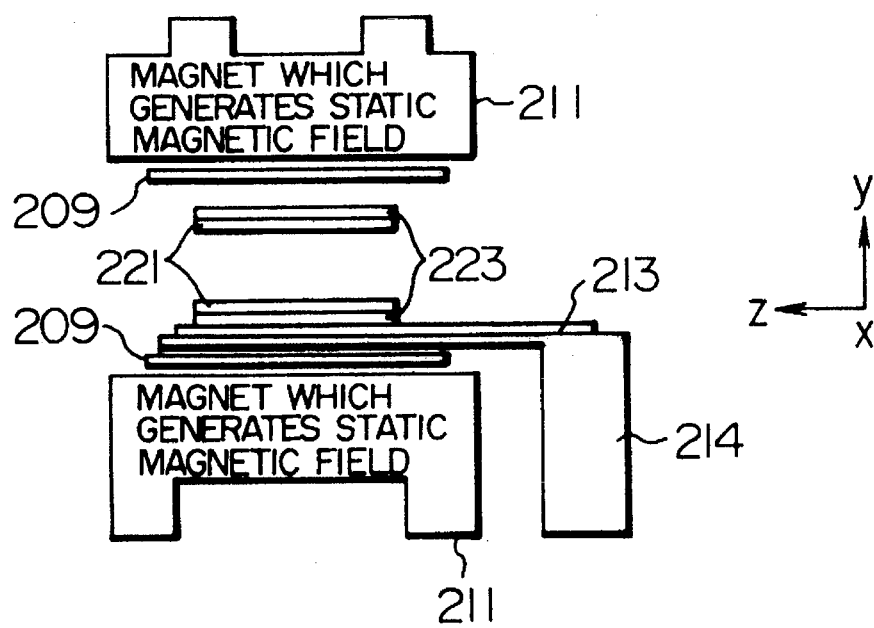

FIG. 2 is a block diagram showing an example of the construction of an MRI apparatus to which the present invention is applied. In the drawing, reference numeral 201 denotes a controller, 202 is an RF (radio frequency) pulse generator, 203 is a power amplifier, 204 is an RF coil for detecting signals generated from an inspected object 212 and generating an RF magnetic field, 205 is a signal detection system, 206 is an A/D converter, 207 is a signal processor and 208 is a display. Reference numeral 209 denotes a set of gradient coils for generating three gradients orthogonal to one another and 210 is a current source (driver) for driving the coil 209. Reference numeral 211 denotes a magnet for generating a uniform static magnetic field in a z direction. The controller 201 has the functions of outputting various instructions to various devices at a predetermined timing. The output of the RF pulse generator 202 is amplified by the RF power amplifier 203 and excites the RF coil 204. The signal received by the RF coil 204 is passed through the signal detection system 205, is subjected to A/D conversion by the A/D converter 206, is then converted to an image by the signal processor 207 and is thereafter displayed on the display 208. The human body 212 as the inspected object is placed on the bed 213, and the bed 213 is so constructed as to be movable on a supporter 214. Incidentally, FIGS. 1 to 7 and 9 schematically show the sectional shape of the coil which crosses a y-z plane passing through the center of the coil.

In FIG. 1, FIGS. 4 to 7 and FIG. 9, a movable, small gradient coil 221 includes at least one of gradient coils for generating three gradients orthogonal to one another.
(First Embodiment)

FIG. 1 is a sectional view showing the arrangement of the coils according to the first embodiment of the present invention.

A movable, small, main gradient coil (second gradient coil) 221 is completely separated from a gradient coil (first gradient coil) 223 for correction. The small, main gradient coil is movable in the direction (z) of the static magnetic field, but the gradient coil 223 for correction is fixed to the magnet 211 for generating the static magnetic field. Because the small, main gradient coil 221 and the gradient coil 223 for correction can be separately disposed, the intensity of the gradient magnetic field per unit current, which develops at the center of each of these gradient coils, is greatly different from that of the other. As a result, the gradient magnetic field substantially generated as the difference of these fields becomes great and current-to-magnetic field transformation efficiency becomes high. It will be assumed hereby, for example, that a current I1 flows through a round winding coil having a radius a and the number of turns n1. It will be further assumed that a current I2 is caused to flow through a coil (e.g. a solenoid coil) having a radius (a+2d), the total number of turns of n2 and a density distribution of windings of $d/(d^2+z^2)$ in order to offset the magnetic field generated by the round winding coil outside the same. Here, z is the coordinates of the coil in the axial direction. At this time, the condition under which the magnetic fields occurring on the conductor encompassing both coils is given by the following formula:

$$I1 \times n1 \times [a/(a+d)]^2 = n2 \times I2 \quad (1)$$

The sum $h_T$ of the magnetic fields occurring at the center of the coils is expressed by the following formula (2):

$$h_T = [1 - a^3/(a+d)^3] \quad (2)$$

Incidentally, it is a self-shielded coil in which the magnetic field $h_1$ (I1) generated by the current I1 (corresponding to the main gradient magnetic field) and the magnetic field $h_2$ (I2) generated by the current I2 (corresponding to the gradient magnetic field for correction) offset with each other on the conductor encompassing the coil having the number of turns n1 and the coil having the number of turns n2. The region which is used in the MRI apparatus is the central region of the space generated by the coil having the number of turns n1. The sum $h_T$ of the magnetic fields in the central region is given as the difference (formula (3)) between the magnetic field $h_1$ (I1) and the magnetic field $h_2$ (I2):

$$\alpha = (h_1(I1) - h_2(I2)) \quad (3)$$

The closer the radius (a+d) of the coil to the value $\underline{a}$, the closer becomes the value $\alpha$ to zero.

Therefore, $\zeta$ defined by the formula (4) will be considered.

$$\zeta = |(h_1(I1) - h_2(I2)|/h_1(I1) \quad (4)$$

Here, the term $h_1$ (I1) represents the value at the central region in the case of the main magnetic field alone, and $|h_1$ (I1)$-h_2$ (I2)$|$ represents their difference. Accordingly, the formula (4) represents the value in the case of the magnetic field generated by the self-shielded coil in comparison with the value in the case of the main magnetic field alone.

It will be assumed, for example, that the small main gradient coil is a round coil having a radius $\underline{a}$ and the gradient coil for correction is a coil having a radius (a+2d). When d=0.05a or in other words, when their difference is 5% of the radius $\underline{a}$, $\zeta=0.14$ and the sum of the magnetic fields at the center of both coils drops by 14% in comparison with the magnetic field in the case of the main gradient magnetic field coil alone. When d=0.3a or in other words, when their difference is 30% of the radius, $\zeta=0.54$, and this value is by about four times greater than the value when their difference is 5% of the radius, and the sum of the magnetic fields is 54% of the case of the small main gradient coil alone. As described above, the greater the value d or in other words, the greater the space between both coils, the greater becomes $\zeta$. It can be thus appreciated that field generation efficiency ($\zeta$) of the coil can be remarkably improved by increasing the distance between the small main gradient coil and the gradient coil for correction. The difference of field generation efficiency of the coil ($\zeta=0.14, 0.54$) is the ratio between the magnetic field and the current and when it is converted to a power ratio, it is $(0.54/0.14)^2 \approx 15$, and when converted to power, the difference of field generation efficiency of the coils corresponds to about 15 times. In other words, power necessary for generating a predetermined gradient magnetic field may be smaller when the difference of the radii of both coils is greater.

Further, the moving part is only a part of the small main gradient coil 221. Accordingly, the support mechanism can be made lighter in weight than when both coils are moved. When the gradient magnetic field generated by the small main gradient coil 221 at the center of the coil is made greater than the gradient magnetic field generated by the gradient coil 223 for correction at the center of the coil, current-to-magnetic field transformation efficiency can be improved in comparison with the opposite case. For, current-to-magnetic field transformation efficiency of the gradient coils as a whole is determined by efficiency of the coil which generated the greatest gradient magnetic field, and this field is generated by the second gradient field coil having high efficiency. Further, the centers of both gradient magnetic fields must be brought into alignment with each other. Since the correction quantity of the eddy current is proportional to the intensity of the magnetic field generated by the second gradient coil and to the time change ratio, the correction effect can be made uniform inside the inspection space by bringing the centers of both gradient magnetic fields into conformity with each other.

(Second Embodiment)

Figure 5:
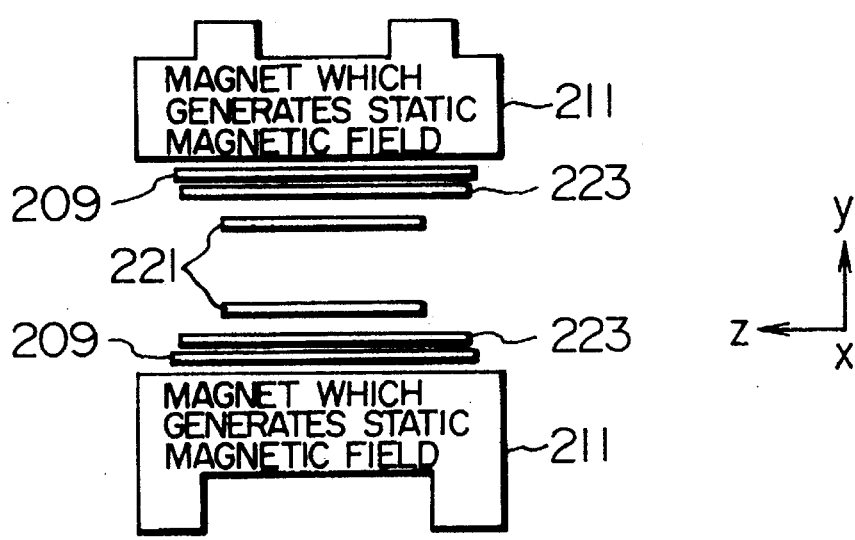
FIG. 5 is a sectional view showing the arrangement of a coil of the second embodiment of the present invention.

FIG. 5 is a sectional view showing the arrangement of the coils in the second embodiment of the present invention.

In FIG. 5, a large gradient coil 209 (third gradient coil) used in conventional apparatuses is shown disposed simultaneously in addition to the small main gradient coil 221 and the gradient coil 223 for correction. When parts of the body other than the head are imaged, the small main gradient coil 221 is moved from near the center of the magnet for generating the static magnetic field to the outside and after the imaged part of the body is moved close to the center of the magnet, imaging is then carried out by using the large gradient coil 209. In this way, image distortion resulting from geometric non-linearity of the gradient magnetic field generated by the small main gradient coil can be reduced. Incidentally, the gradient coil 209 is fixed to the magnet 211 for generating the static magnetic field.

Figure 6:
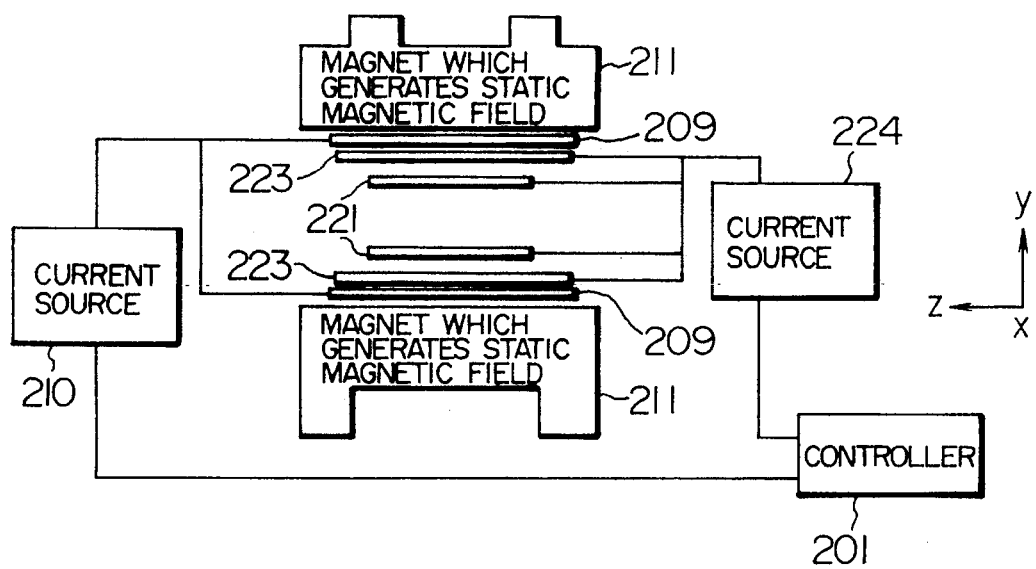
FIGS. 6 and 7 are sectional views showing the first and second constructions of a coil driving circuit in the coil arrangement in the second embodiment of the invention.
Figure 7:
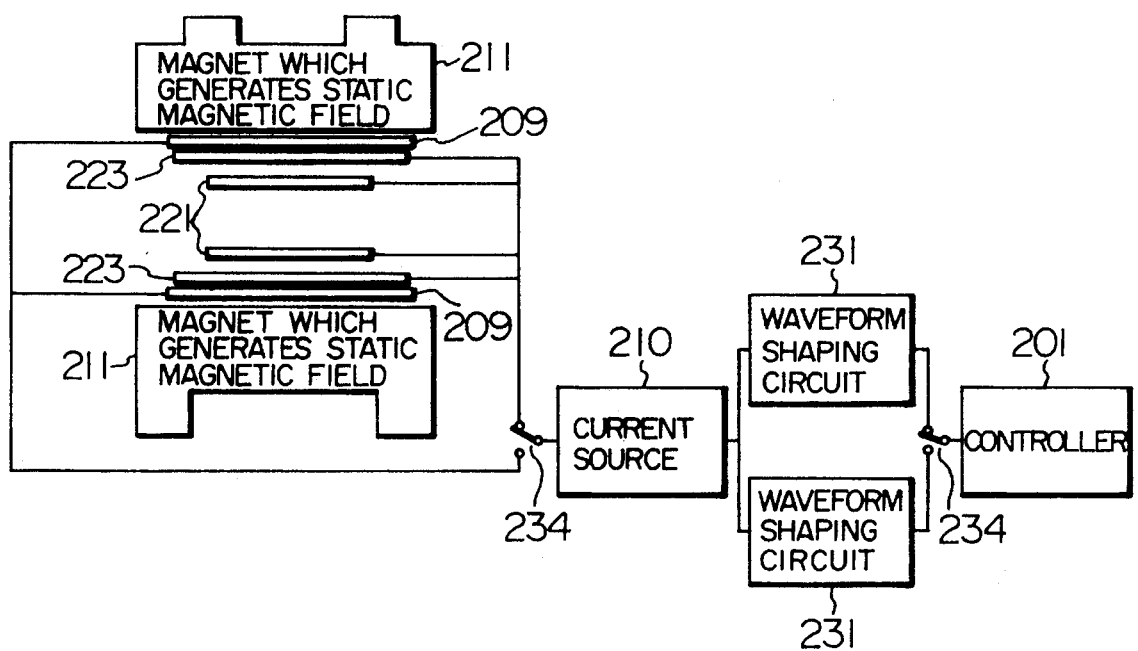

FIGS. 6 and 7 show the first and second constructions of the coil driving circuit in the coil arrangement in the second embodiment.

FIG. 6 shows the first construction of the power supplies for driving the coils. The gradient magnetic fields generated by the small main gradient coil 221 and by the gradient coil 223 for correction preferably have similar current waveforms on the time axis so that they always offset each other on the conductor portion of the magnet for generating the static magnetic field. If they have different current waveforms, there occurs the case where the eddy currents offset or do not offset time-wise each other. Accordingly, as shown in FIG. 6, the small main gradient coil 221 and the gradient coil 223 for correction are driven by the same current source 224 so that the small main gradient coil 221 and the coil 223 for correction always pass the currents having the similar waveform. However, because it is not necessary to cause a current having a waveform similar to those of the small main gradient coil 221 and the gradient coil 223 to flow through the large gradient coil 209, the large gradient coil 209 is driven by the current source 210 which is independent of the small main gradient coil 221 and the gradient coil 223 for correction.

Further, the second construction of the power supplies for driving the coils is shown in FIG. 7.

To reduce the cost of the apparatus, this construction uses the same power supply as that of the small main gradient coil 221 and the coil 223 for correction as the driving current source and changes over the power supply by a switch, whenever necessary, without disposing the separate driving current sources shown in FIG. 6.

According to this construction, it is necessary to determine the respective inductances at the time of driving lest the maximum driving voltage and the maximum driving current are exceeded. In other words, the reverse electromotive voltage occurring across the coil terminals should not exceed the maximum driving voltage of the power supply. This value is represented by $V=-L(di/dt)$ (where V is the reverse electromotive voltage, L is the inductance of the coil and i is the current). Whereas a current which changes by about 250 μs is caused to flow through the small main gradient coil 221 and the gradient coil 223 for correction, a current which changes by about 1 ms is caused to flow through the large gradient coil 209. Accordingly, if the magnitude of the current is the same, the reverse electromotive forces occurring across the coil terminals can be made the same value by setting the inductances of the small main gradient coil 221 and the gradient coil 223 for correction to ¼ of the inductance of the gradient coil 209.

When the coil parameters are set as described above, the same power supply can be used in common for the different coils. Incidentally, it is necessary in this case to make the time constants of the waveforms shaping circuit 231 for correcting the eddy currents different because the magnitude of the eddy currents generated from the gradient coil 209, the small main gradient coil 221 and the gradient coil 223 for correction are different from one another. As shown in FIG. 7, this waveform shaping circuit 231 is interposed between the power supply 210 for driving the gradient coil 209 or the small main gradient coil 221 and the gradient coil 223 for correction and the controller 1, and shapes the waveform of the gradient magnetic field generated by the controller.

Figure 8:
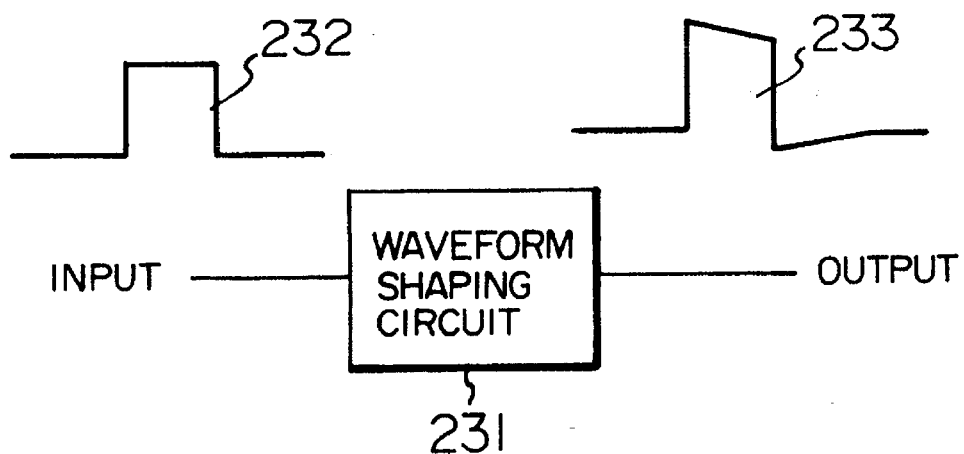
FIG. 8 is a waveform diagram showing an input/output waveform of a waveform shaping circuit in the second construction of the coil driving circuit in the second embodiment.

FIG. 8 shows the input/output waveforms of the waveform shaping circuit in the second construction of the coil driving circuit in the second embodiment of the present invention.

When an input rectangular wave 232 is inputted, this circuit stresses the edge of the output waveform 233 and corrects insufficient sharpness of the rise and fall of the gradient magnetic field generated by the eddy current. Since this insufficient sharpness depends on the magnitude of the eddy current, it must be corrected with the kind of the gradient coils used.

(Third Embodiment)

Figure 9:
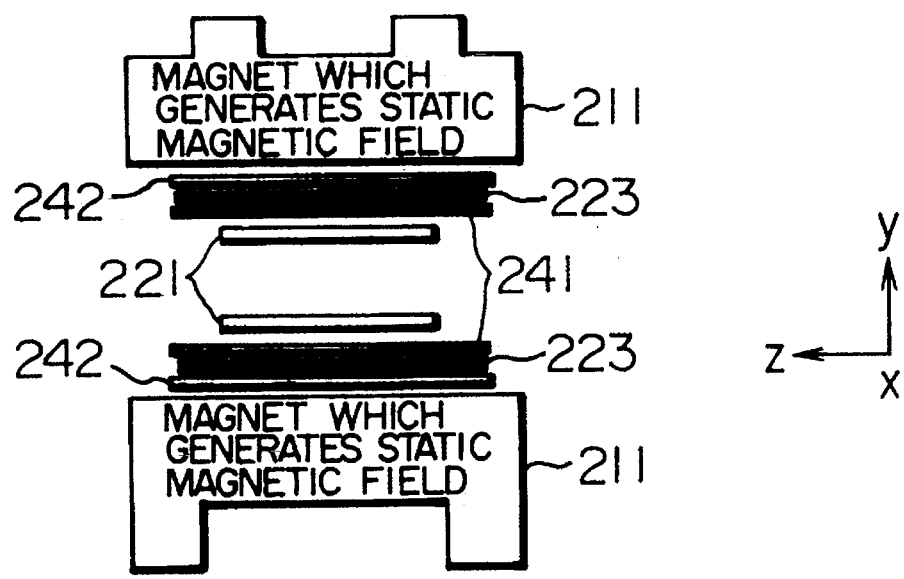
FIG. 9 is a sectional view showing the arrangement of a coil of the third embodiment of the present invention.

FIG. 9 is a sectional view showing the coil arrangement according to the third embodiment of the present invention.

In FIG. 9, the gradient coil 209 (third gradient coil) comprises two sets of self-shielded coils 241 and 242, and the gradient coil 223 for correction is interposed between each set of the coils so as to correct the eddy current. The self-shielded coils 241 and 242 generate the gradient magnetic fields in the mutually opposite directions, and both magnetic fields offset each other at the conducting part of the magnet for generating the static magnetic field and restrict the occurrence of the eddy current. A small gap is secured between the gradient coils 241 and 242 in order to improve current-to-magnetic field transformation efficiency, and this gap is generally a dead space. The gap may be a mere air layer or a support of the gradient coil. In this embodiment, the gradient coil 223 for correction is disposed in this gap. According to this construction, an excessive space for the gradient coil 223 for correction becomes unnecessary, and space utilization efficiency inside the bore of the magnet for generating the static magnetic field can be improved. Incidentally, the gradient coil 209 is fixed to the magnet 211 for generating the static magnetic field.

(Fourth Embodiment)

Figure 10A:
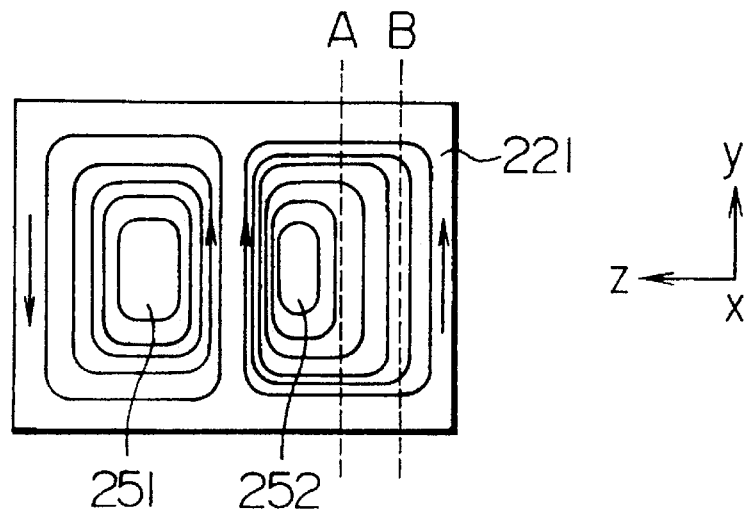
FIG. 10A is a schematic view showing a winding shape of a gradient coil in the fourth embodiment of the present invention.
Figure 10B:
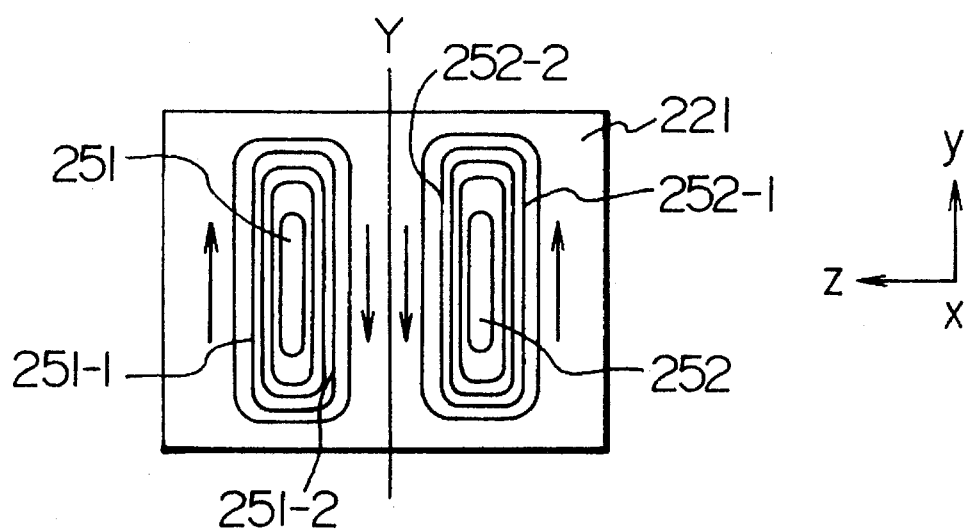
FIG. 10B is a schematic view showing a winding shape of a gradient coil according to the prior art.

FIG. 10A shows the winding shape of the gradient coil, and FIG. 10B shows the winding shape of the gradient coil according to the prior art example.

FIG. 10A shows an example of the shapes of the windings 251 and 252 which balance the force the small main gradient coil 221 receives from the static magnetic field, and do not generate the torque. FIG. 10A is a view when one of the coils which generates the x direction gradient magnetic field is viewed from the x direction. The other coil is wound on the opposite side to FIG. 10A (on the back of the sheet of the drawing). In FIGS. 10A and 10B, arrows indicate the flowing direction of the currents. In the gradient magnetic field coil according to the prior art shown in FIG. 10B, the windings 251 and 252 of the coil are symmetric with respect to the x-y plane inclusive of the y axis (Y shown in FIG. 10B) with the substantial center of the gradient magnetic field being the origin of the coordinates (x, y, z) (which is substantially the center of the gradient magnetic field due to the structure of the coils). Accordingly, the forces which the gradient coils receive from the static magnetic field are mutually opposite in the x direction between the windings 251-1 and 251-2 and between 262-1 and 252-2. Therefore, the torque generated by the windings 251-1 and 251-2 and the torque generated by the windings 252-1 and 252-2 lie in the mutually opposite directions with respect to the center of the gradient magnetic field, and they do not generate the torque as a whole. In order to secure linearity of the z direction gradient magnetic field, however, a sufficient length is necessary in the z direction, and the length from the center of the gradient magnetic field to the edge has generally been greater than the human head. Accordingly, even in the case of the head-only gradient coil, the diameter of the gradient coil must be such that the human shoulder can be accommodated in it, and this size condition substantially determines the coil diameter in practice.

However, unlike FIG. 10B, the shapes of the windings 251, 252 shown in FIG. 10A are such that the structural centers of the coils do not coincide with the center of the gradient magnetic field, and they do not have a symmetric plane. In other words, the center of the gradient magnetic field (which exists in the region of the portions A to B shown in FIG. 10A) is off from the structural center of the coils. In the example shown in FIG. 10A, the winding 251 and the winding 252 of the coils generally have mutually different shapes and cannot be superposed with each other unlike the case shown in FIG. 10B. Assuming that the portion from A to B which is near the end of the coil structure is the space in which the inspected region is disposed for imaging, the intended part (e.g. the head) can be disposed in the proximity of the center of the gradient magnetic field without loading the portion having a large width such as the human shoulder. In such a gradient magnetic field coil, a torque is generally generated due to interference with the static magnetic field when a current flows, and the gradient coil moves. Therefore, a device for fixing the coil has been necessary. Such a structure of the moving coil is not preferred because the weight of the coil increases and easy movement is impeded. Therefore, when the coils having the different shapes are employed as shown in FIG. 10A, too, the shapes of the coils are preferably selected so that the overall torque is in equibrium and the coils do not move. These objects can be accomplished when the windings of the coils satisfy the following formula (5):

$$\int r \times (dl \times B) = 0 \quad (5)$$

In the formula (5) given above, r is a position vector from the center of the gradient magnetic field to the calculation point, dl is a current element vector, and B is an external magnetic field vector which this current element receives. The coils shown in FIG. 10A are so constituted as to satisfy this formula (5). The coil having such a construction can be applied not only to the small main gradient coil 221 but also to the gradient coil 223 for correction which corrects the eddy current.

Next, each embodiment relating to the concrete construction of the movable, small, main gradient coil 221 (second gradient coil) will be explained. Incidentally, the movable, small main gradient coil will be hereinafter referred to as the "local gradient coil" in each of the following embodiment.

(Fifth Embodiment)

Figure 15A:
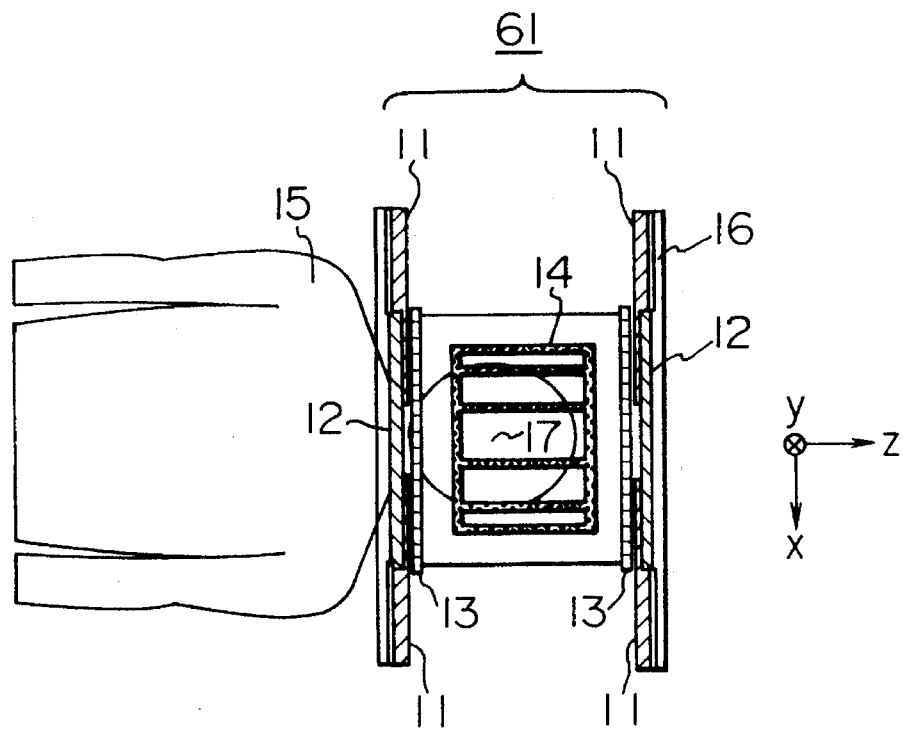
FIGS. 15A, 15B and 16 are a plane view and a front view of a local gradient coil of the fifth embodiment of the invention as viewed from the front surface of the human body and from the head apex, respectively, and a perspective view.
Figure 15B:
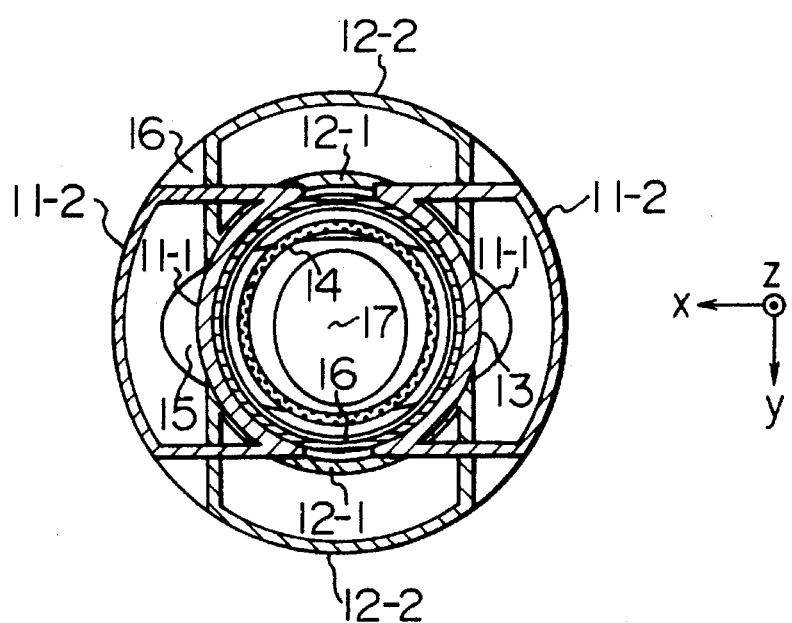
Figure 16:
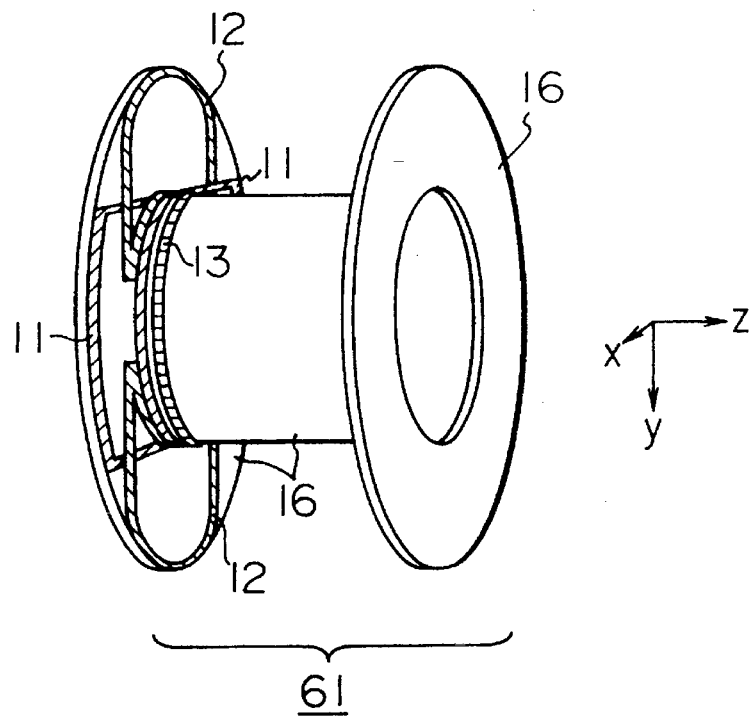

FIGS. 15A, 15B and 16 are a front view of the local gradient coil of the fifth embodiment of the present invention (second gradient coil) when it is viewed from the front surface of the human body, its front view when viewed from the human head its perspective view, respectively.

Next, the local gradient coil (second gradient coil) explained in each of the following embodiments has the following construction.

In FIGS. 15A, 15B and 16, the diameter of the z direction gradient coil 13 is 33 cm. Reference numeral 11 denotes the x direction gradient coil and 12 does the y direction gradient coil. As shown in FIGS. 15A and 15B, the direction of the magnetic fields generated by the coils 11, 12 at the coil center exists in the z direction. As shown in FIGS. 15A, 15B and 16, the bobbin 16 has a cylindrical portion and planes formed at both ends and describing the right angle to the center axis of the cylindrical portion. The coil 13 is disposed on the outer peripheral surface of the cylindrical portion of the bobbin 16, and the coils 11, 12 are disposed on the rectangular planes at both ends of the bobbin 16.

Because the coils 11 and the coil 12 can be so disposed as to avoid the human shoulder, the conducting wire portions 11-1, 12-1 of the coils 11, 12 for generating the magnetic fields effective for imparting a gradient to the static magnetic field can be disposed in the proximity of the part for imaging. In this instance, the conducting wire portions 11-1, 12-1 are the portions of the conductor constituting the coils 11, 12 that are disposed on the outer peripheral surface of the cylindrical portion.

Figure 11A:
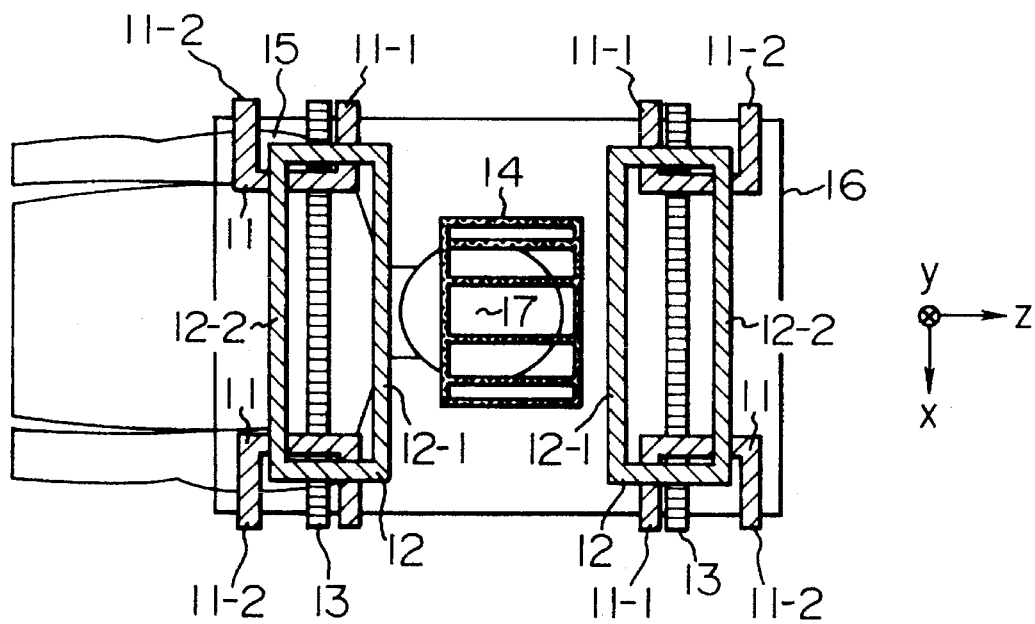
FIGS. 11A and 11B are a plane view and a front view of a local gradient coil according to the prior art, respectively.
Figure 11B:
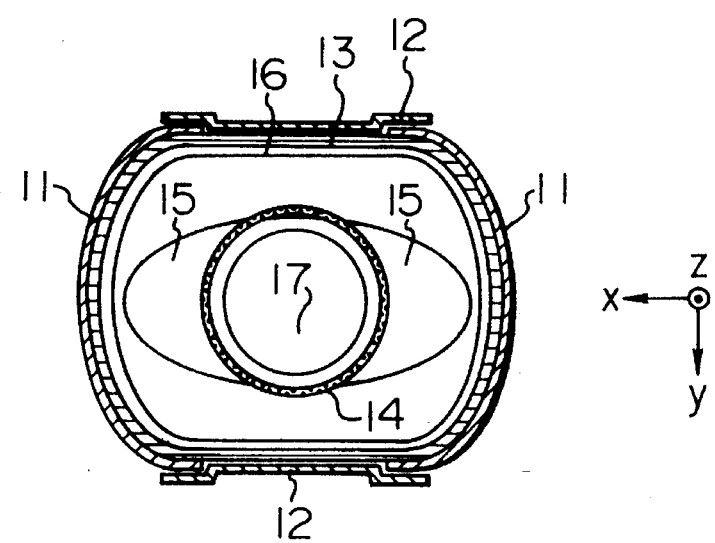
Figure 12:
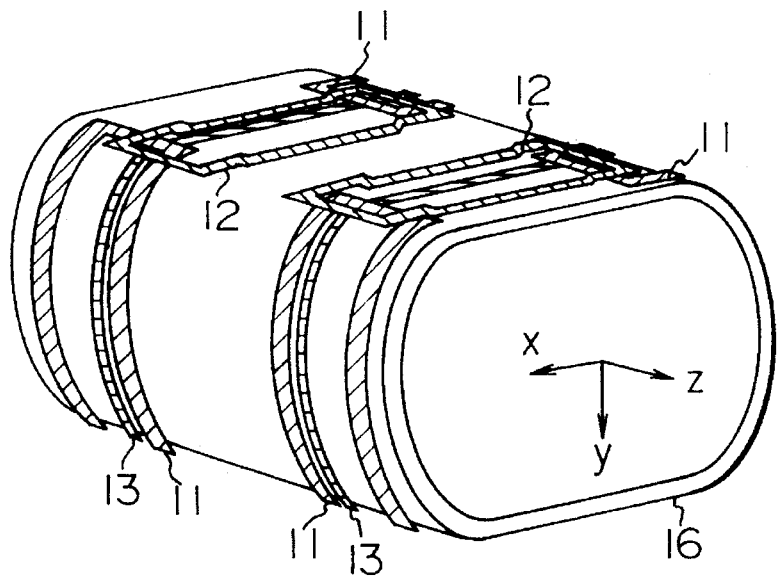
FIG. 12 is a perspective view of a local gradient magnetic field coil according to the prior art.
Figure 13:
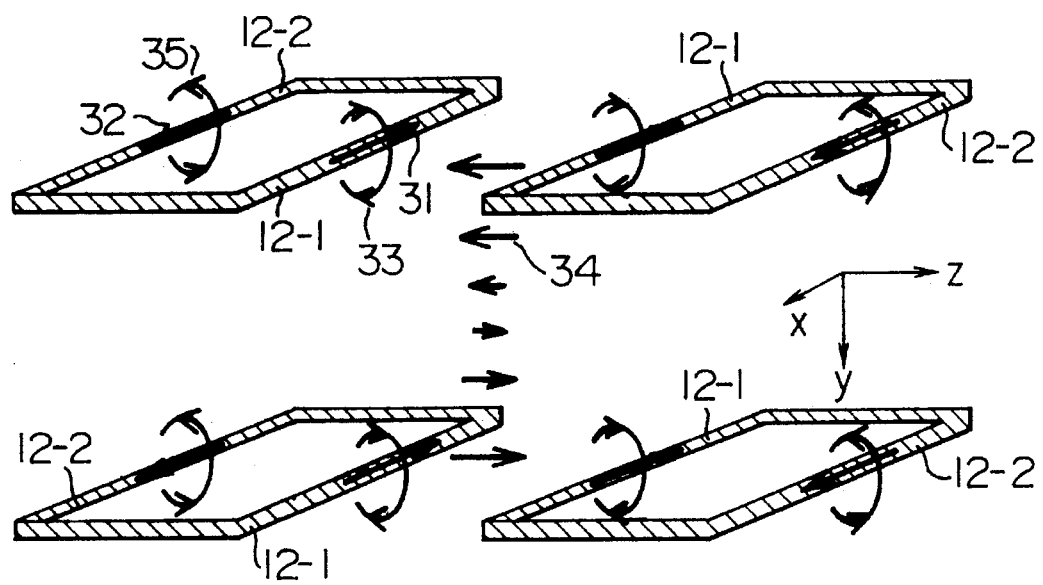
FIG. 13 is a perspective view showing a current flowing through a y-direction gradient coil and a gradient magnetic field in a local gradient coil according to the prior art.
Figure 14A:
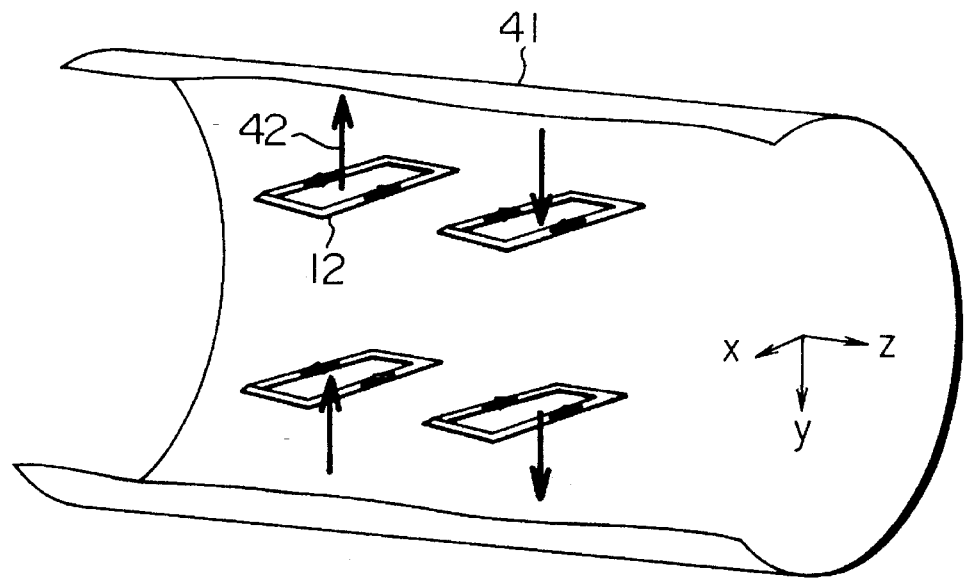
FIG. 14A is a perspective view showing a cylindrical conductor shield, a y-direction gradient coil and a varying magnetic field occurring at the time of rise of the gradient magnetic field according to the prior art.
Figure 14B:
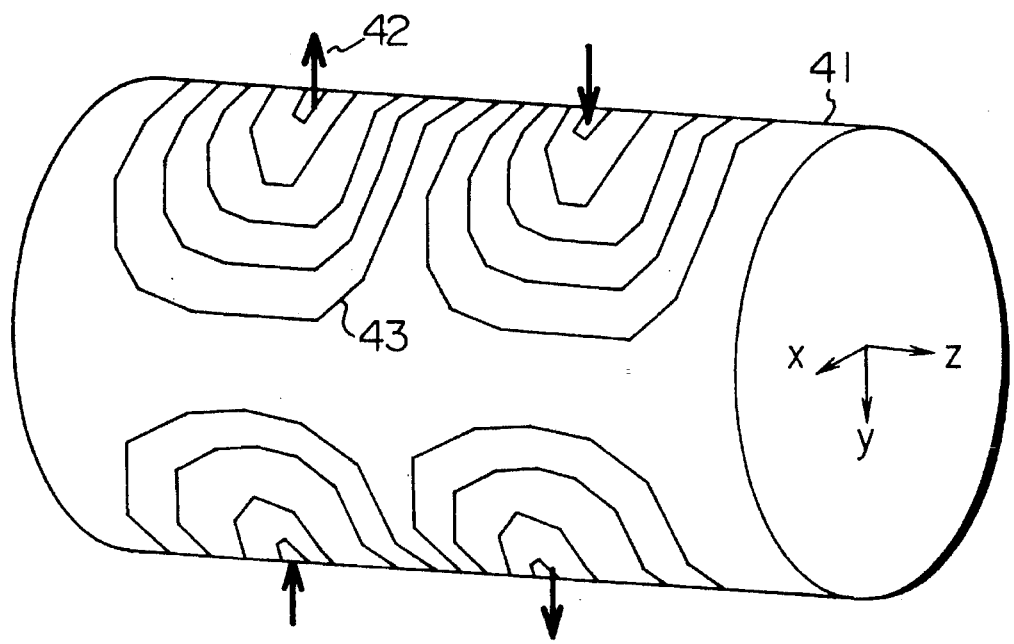
FIG. 14B is a perspective view showing an eddy current occurring on the cylindrical conductor shield due to the varying magnetic field occurring at the time of the gradient magnetic field according to the prior art.

The sizes of the coils 11 and 12 shown in FIGS. 15A and 15B have no much difference from the size of the coil 12 for imparting the gradient in the y direction according to the prior art shown in FIGS. 11A and 11B. Accordingly, the degree of linearity of the gradient magnetic field generated by the coils in the imaging region is not deteriorated. Furthermore, because the distance between the coils and the human heart becomes greater than in the conventional gradient magnetic field coil, safety is higher, as well.

Figure 17:
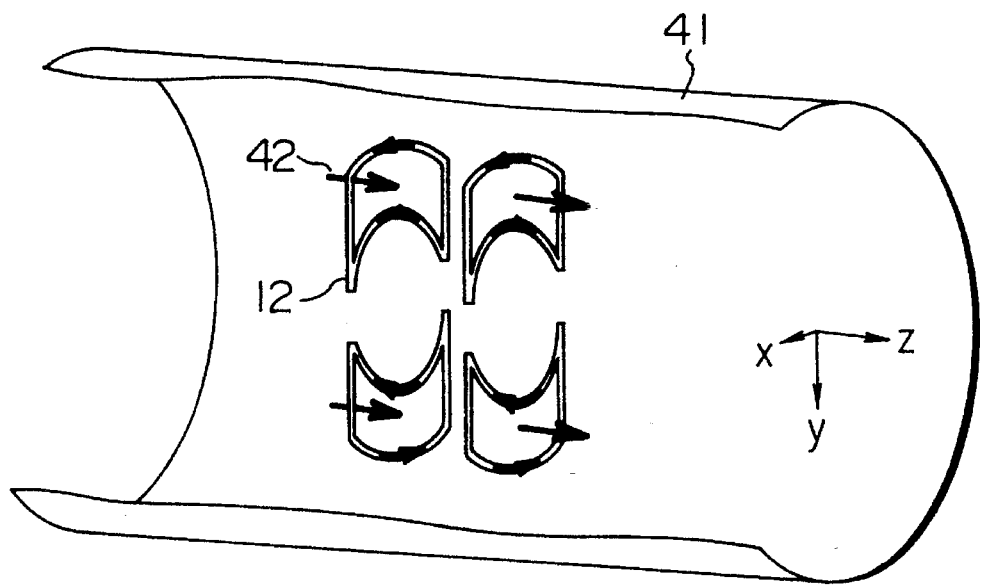
FIG. 17 is a perspective view showing the relation between the direction of the varying magnetic field occurring at the time of rise of the y-direction gradient coil of the fifth embodiment and the surface of the cylindrical conductor shield.

FIG. 17 is a perspective view showing the relation between the direction of the varying magnetic field which occurs at the rise of the y direction gradient coil 12 in this embodiment and the cylindrical conducting shield surface.

As shown in FIG. 17, the direction of the varying magnetic field 42 occurring at the rise of the gradient magnetic field of the coil 12 is in parallel with the conductor plate surface, and the quantity of the magnetic field crossing the conductor is smaller than in the conventional apparatus. In other words, the eddy current occurring on the cylindrical conductor shield 41 at the rise and fall of the gradient magnetic field can be reduced. This also holds true of the coil 11.

(Six Embodiment)

Figure 18A:
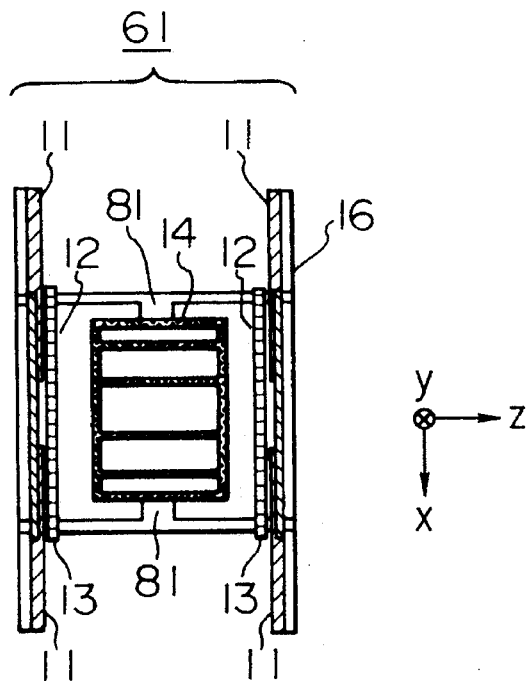
FIGS. 18A and 18B are a plane view and a front view showing a local gradient coil which is of a unitary type with an RF probe according to the sixth embodiment of the present invention.
Figure 18B:
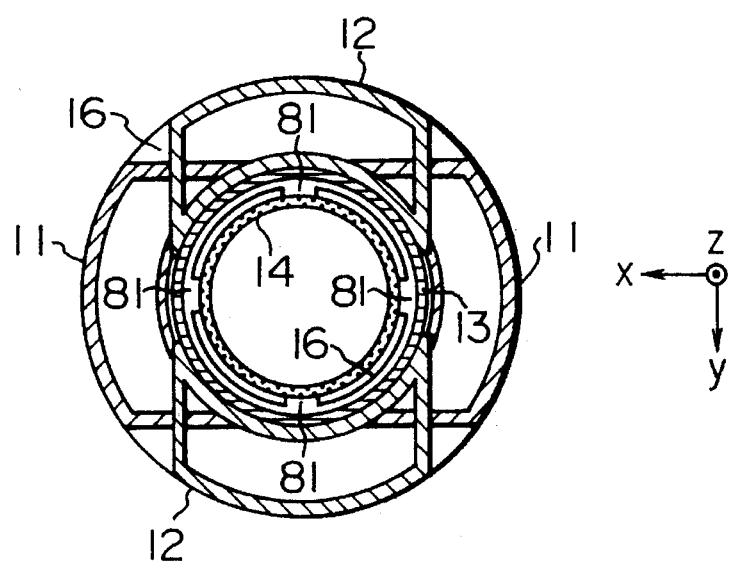

FIGS. 18A and 18B show the sixth embodiment of the present invention, and are a plane view and a front view of a local gradient coil of a unitary type with an RF probe.

As shown in FIGS. 18A and 18B, the RF probe 14 is fixed by a prop 81 to the bobbin 16 for supporting the local gradient coil, and in this way, a unitary type local gradient coil comprising the unitary combination of the RF probe and the local gradient coil can be constituted. FIG. 18A is a plane view when viewed in the y direction and FIG. 18B is a front view when viewed from the z direction.

In the case of the local gradient coil directed to brain function imaging, the length of the RF probe 14 may be not longer than 20 cm. For, the size of the brain of adult males is at most about 20 cm, and if the length of the RF probe is greater than 20 cm, signals from the regions other than the intended imaging region mix and invite the occurrence of artifacts and the drop of the signal-to-noise ratio (S/N).

The RF probe 14 can be shielded electromagnetically from outside by disposing an RF shield made of a metal between the RF probe 14 and the bobbin 16. When this shield is employed, the sensitivity drops as the RF shield becomes closer to the RF probe. Accordingly, the distance between the RF shield and the RF probe is preferably as great as possible. For example, the RF probe 14 can be shielded electromagnetically from outside by bonding a copper foil as the RF shield to the inner wall of the bobbin 16.

(Seventh Embodiment)

Figure 19A:
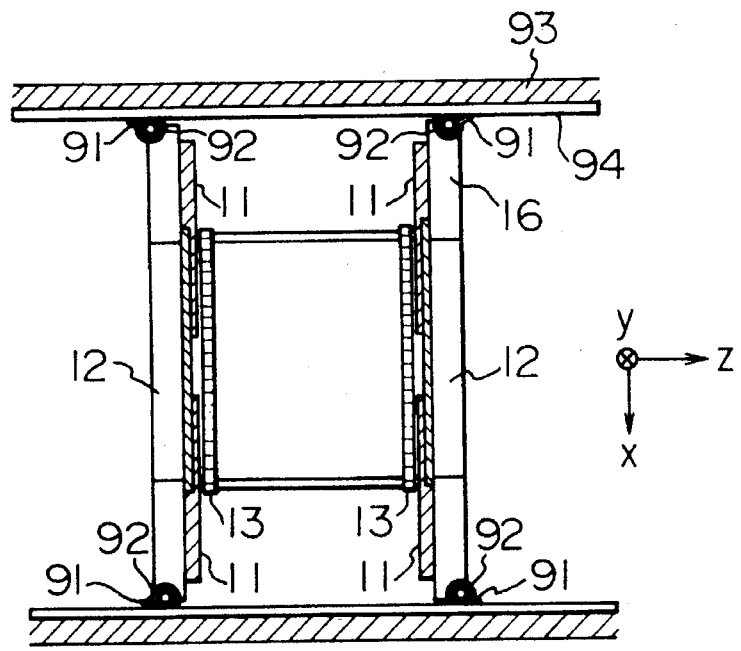
FIGS. 19A and 19B are a plane view and a front view showing the first construction, wherein rollers are fitted to a bobbin for supporting a local gradient coil, according to the seventh embodiment of the present invention.
Figure 19B:
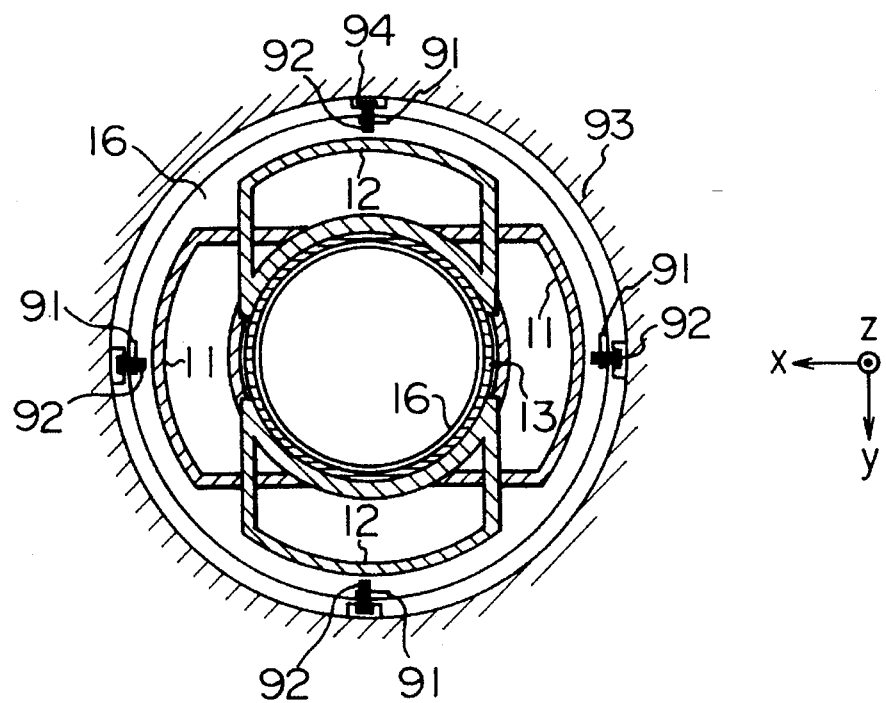

FIGS. 19A and 19B show the seventh embodiment of the present invention and are plane view and a front view showing the first construction wherein rollers 92 are fitted to the bobbin for supporting the local gradient coil. FIG. 19A is a plane view when viewed in the y direction and FIG. 19B is a front view when viewed from the z direction.

Next, the disposition of the local gradient coil according to the present invention will be explained. As shown in FIGS. 19A and 19B, the rollers 92 each equipped with a stopper 91 are fitted to the supporting bobbin 16. Grooves 94 into which these rollers 92 are fitted are defined on the inside wall 93 of the cylindrical space for loading the human body in the MRI apparatus and the movement of the gradient field coil can be thus facilitated. In other words, during use of the gradient magnetic coil, the rollers 92 are put into the grooves 94 so as to slide the local gradient coil to a desired position. Each stopper 91 is fixed at the target position, and imaging of the intended imaging portion is carried out. When conventional imaging not using the local gradient coil is effected, the stoppers 91 are released, the rollers 92 are put into the grooves 94, and the local gradient coil is slid and can be removed.

Figure 20:
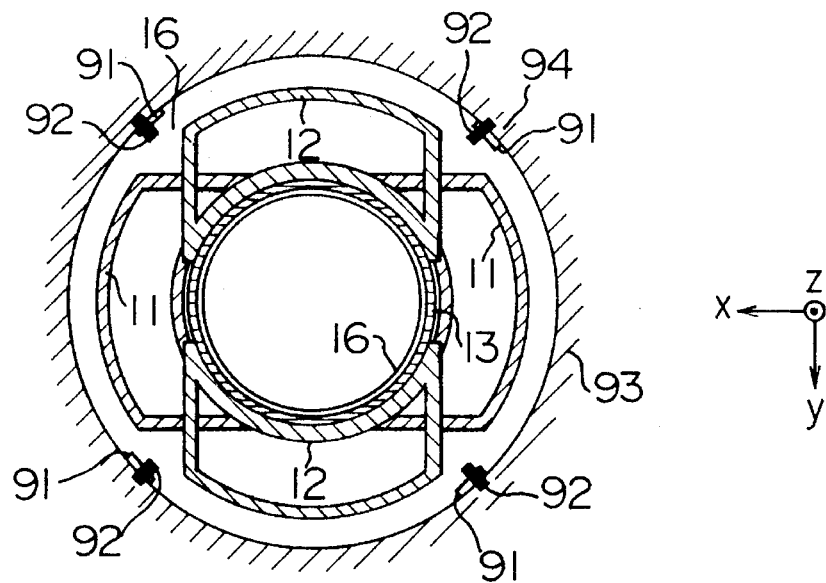
FIG. 20 is a front view showing the second construction, wherein rollers are fitted to the bobbin for supporting the local gradient coil, according to the seventh embodiment of the present invention.

FIG. 20 is a front view showing the second construction in the seventh embodiment of the invention wherein the rollers are fitted to the bobbin for supporting the local gradient coil. The rollers 92 and the grooves 94 of the inside wall may be disposed at positions which are different from those shown in FIGS. 19A and 19B.

Figure 21:
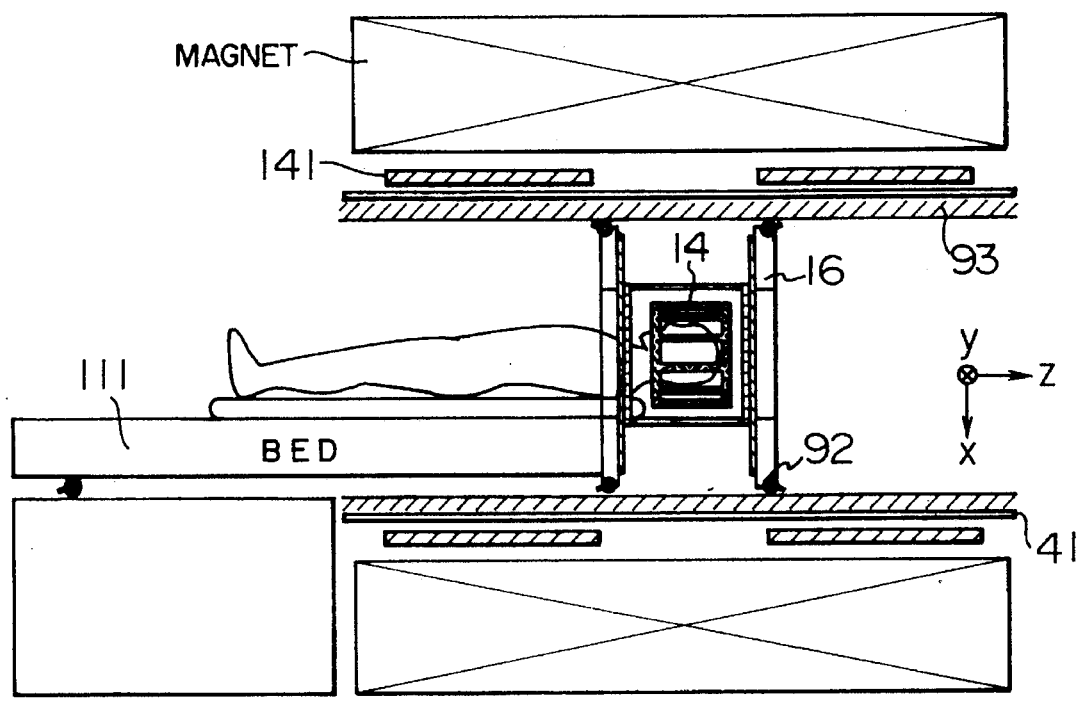
FIGS. 21 and 22 are sectional views showing the position of the local gradient coil integrated with a bed at the time of high speed imaging and at the time of normal speed imaging, respectively.
Figure 22:
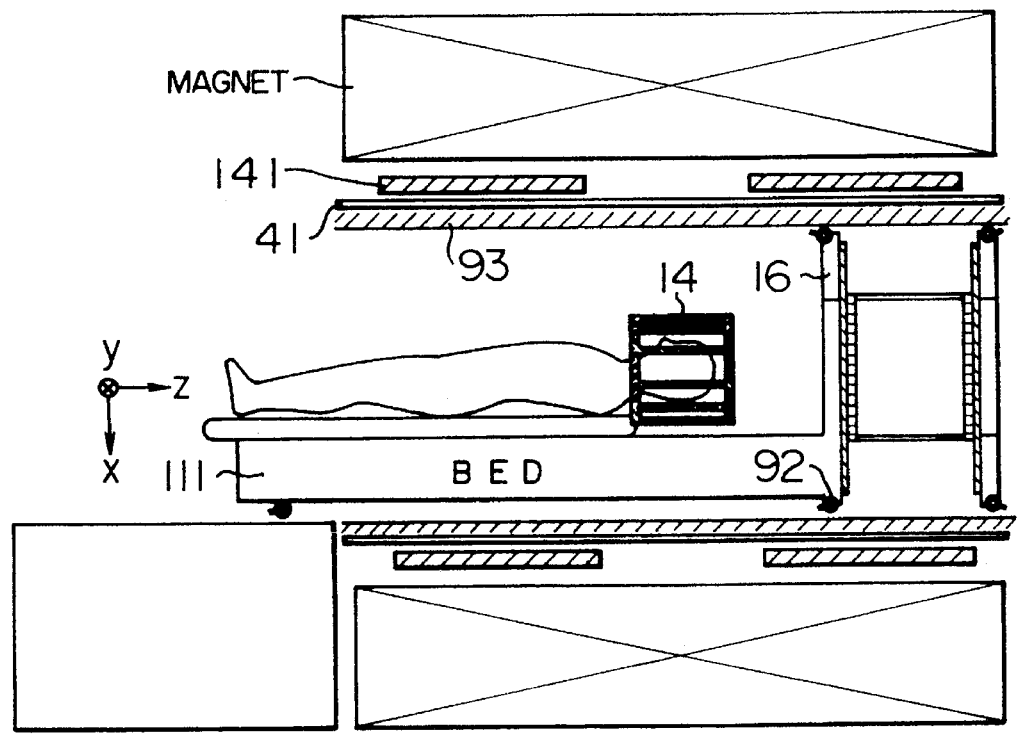

FIGS. 21 and 22 are sectional views showing the positions at the time of high speed imaging and conventional imaging of the local gradient coil integrated with the bed in the seventh embodiment, respectively. The term "conventional imaging" means imaging which does not use the local gradient coil.

When the bobbin 16 for supporting the local gradient coil is integrated with the bed 111, imaging can be made at the position shown in FIG. 21 at the time of high speed imaging, and when conventional imaging is made, the local gradient coil is pushed into the end portion (depth) of the cylindrical inside space as shown in FIG. 22 and imaging can be executed.

Figure 23A:
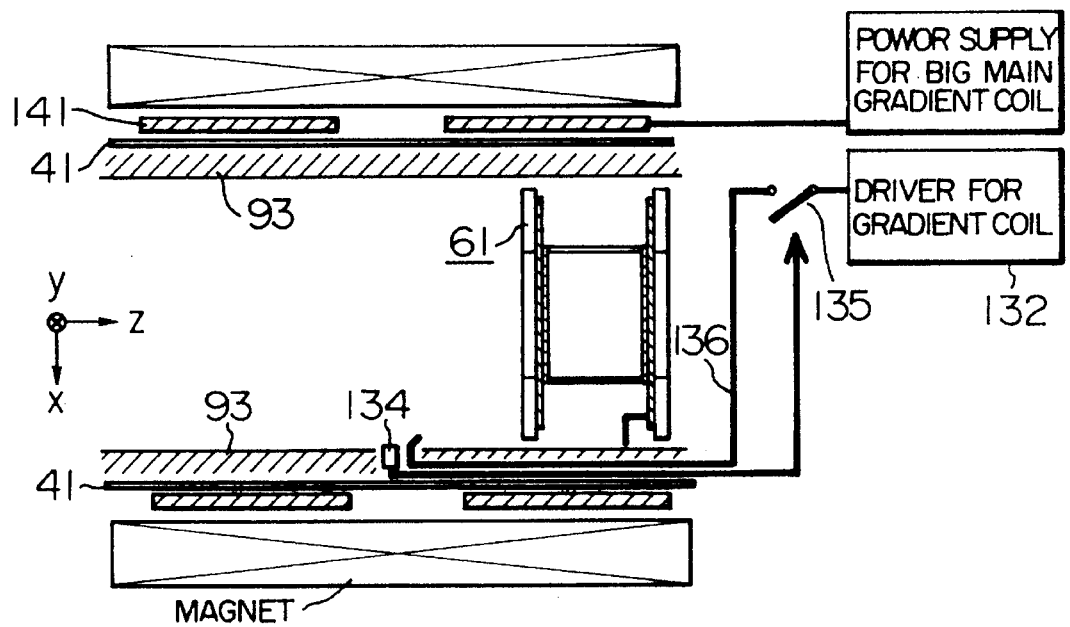
FIGS. 23A, 24A and 25A are partial sectional views showing the first, second and third examples of connection of a driving power supply for the gradient coil at the time of normal speed imaging in the seventh embodiment of the invention.
Figure 23B:
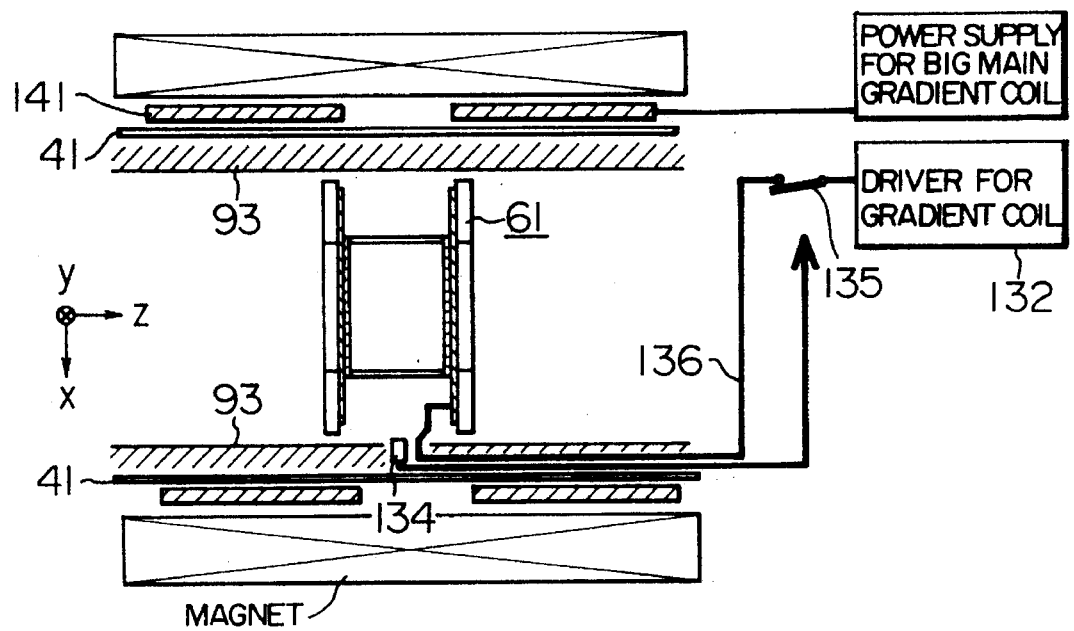
FIGS. 23B, 24B and 25B are partial sectional views showing the first, second and third examples of the connection of the driving power supply for the gradient coil at the time of high speed imaging in the seventh embodiment of the invention.
Figure 24A:
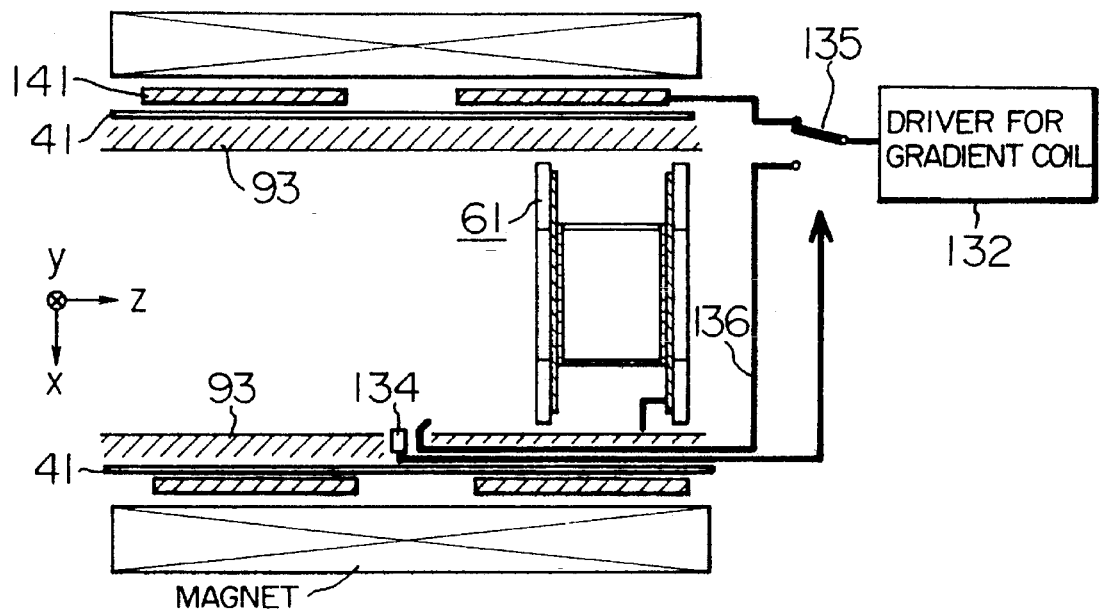
Figure 24B:
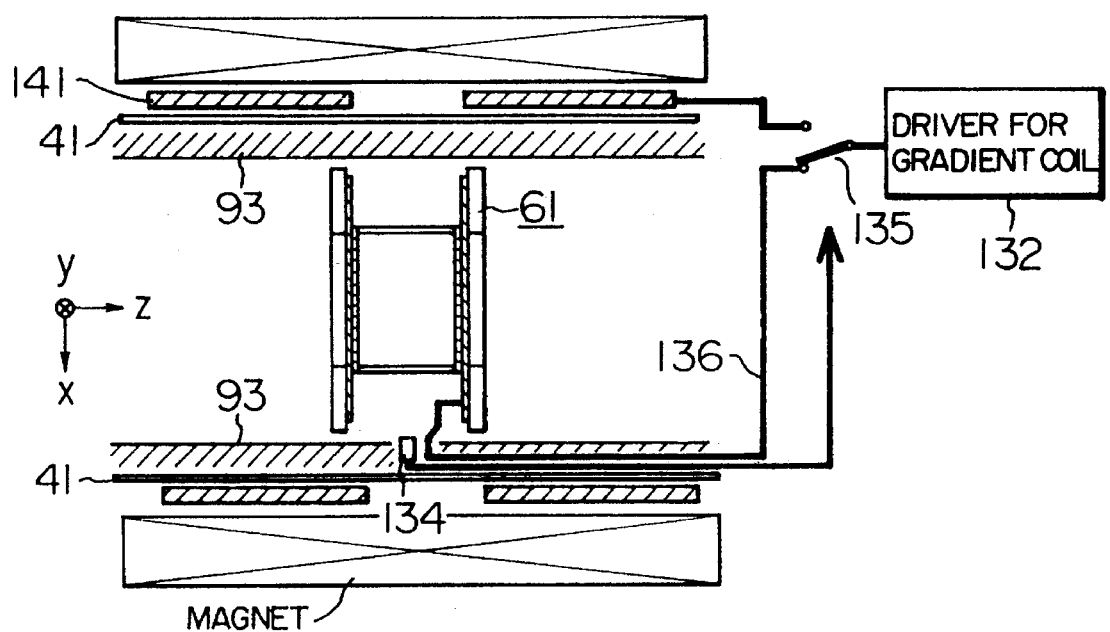
Figure 25A:
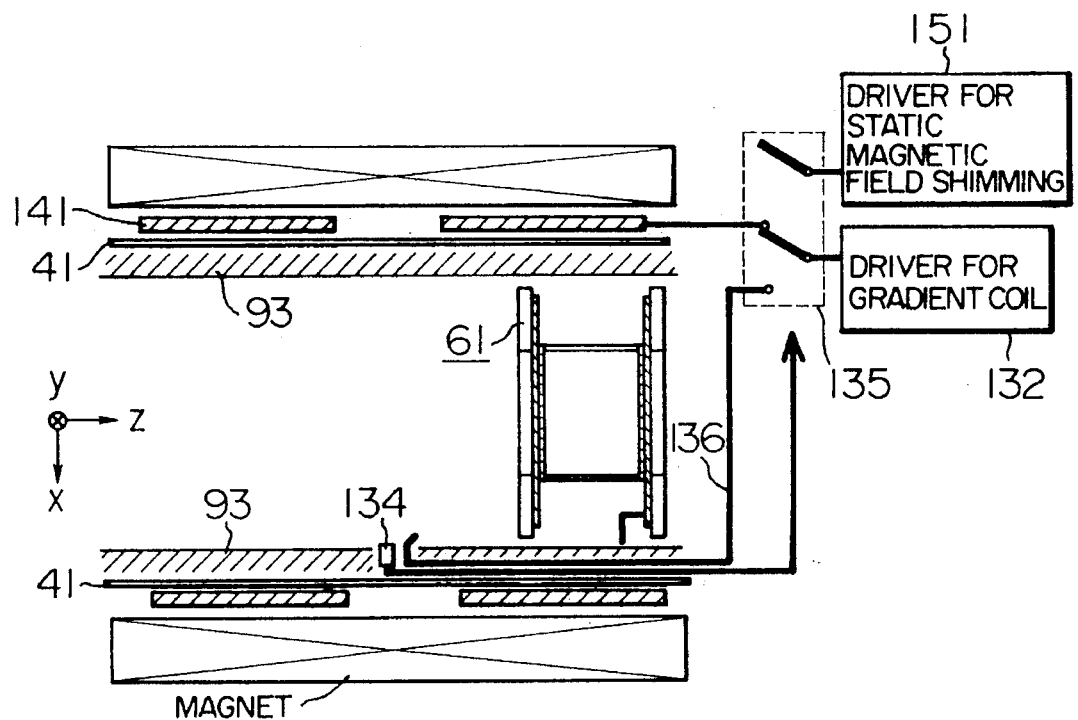
Figure 25B:
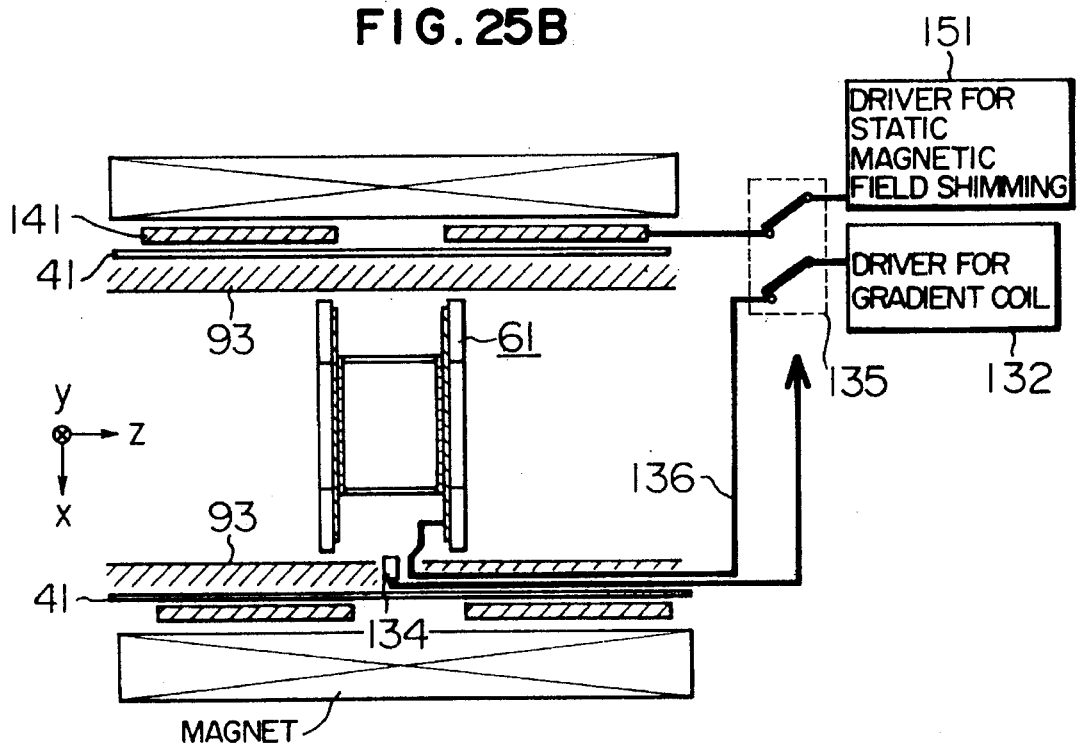

FIGS. 23A, 24A and 25A are partial sectional views showing the first, second and third examples of the connection of the driving power supply for the gradient coil at the time of conventional imaging in this embodiment, respectively, and FIGS. 23B, 24B and 25B are partial sectional views showing the first, second and third examples of the connection of the driving power supply for the gradient coil at the time of high speed imaging in this embodiment, respectively. As shown in FIG. 23A, a switch 135 of the power supply 132 for driving the local gradient coil is kept off at the time of conventional imaging, and is turned on at the time of high speed imaging as shown in FIG. 23B. A cable 136 for connecting the power supply 132 to the local gradient coil is disposed between the inside wall 93 of the cylindrical space and the cylindrical conducting shield 41 as shown in FIGS. 23A, 24A, 25A, 23B, 24B and 25B, and is connected to the local gradient coil at the time of high speed imaging as shown in FIGS. 23B, 24B and 25B. Whether or not the local gradient coil 61 exists at the position of high speed imaging is detected by a position detector 134 and the switch 135 is automatically changed over. Accordingly, an artificial switching mistake can be prevented.

At the time of conventional imaging, the switch 135 is connected to a big main gradient coil 141 (third gradient coil) that has been used for the conventional apparatuses as shown in FIG. 24A. At the time of high speed imaging, on the other hand, the switch 135 is connected to the local gradient coil 61 as shown in FIG. 24B, and the driving power supply can be used in common by the big main gradient coil 141 and the local gradient coil 61.

There is sometimes the case where the big main gradient coil 141 is used for shimming the static magnetic field at the time of high speed imaging, too. However, large power is not necessary because the rise and the fall need not be speed up and the current to be caused to flow through the coil is smaller than the current to be caused to flow through the coil for generating the gradient magnetic field. Accordingly, it becomes unnecessary to prepare two expensive power supplies 132 for driving the gradient coils by using the construction wherein the power supply 151 for shimming the static magnetic field and the power supply 132 for driving the gradient coil are prepared, the power supply 132 is connected to the main gradient coil 141 by the switch 135 at the time of conventional imaging as shown in FIG. 25A, and at the time of high speed imaging, the power supply 132 is connected to the local gradient coil 61 while the power supply 151 is connected to the big main gradient coil 141 as shown in FIG. 25B.

Further, vibration sound generated by the local gradient coil can be reduced by burying a sound absorbing material using a rigid foamed plastic material or a functional power such as polynorbornene or a styrene-butadiene block copolymer to the inside of the bobbin.

Figure 26:
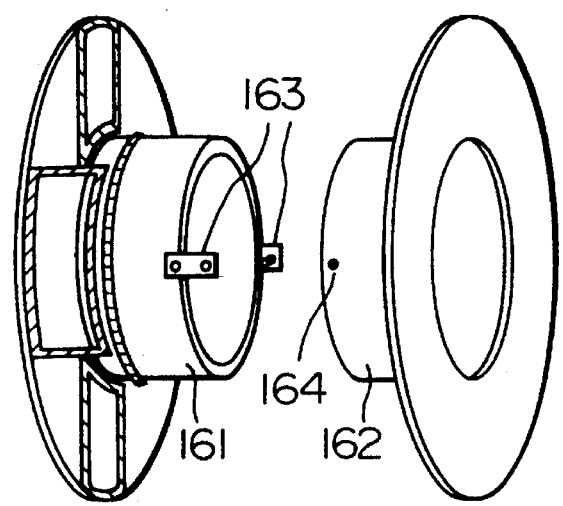
FIG. 26 is a perspective view showing an example of the construction wherein the local gradient coil is dividedly constituted, according to the seventh embodiment of the invention.

FIG. 26 is a perspective view showing an example of the construction wherein the local gradient coil is dividedly constituted in the seventh embodiment of the invention. As shown in FIG. 26, the bobbin is divisible into bobbin parts 161 and 162 as shown in FIG. 26, so that it can be easily portable. The bobbin parts 161 and 162 are integrally coupled by a holder 163 at the position of a hole 164.

(Eighth Embodiment)

Figure 27A:
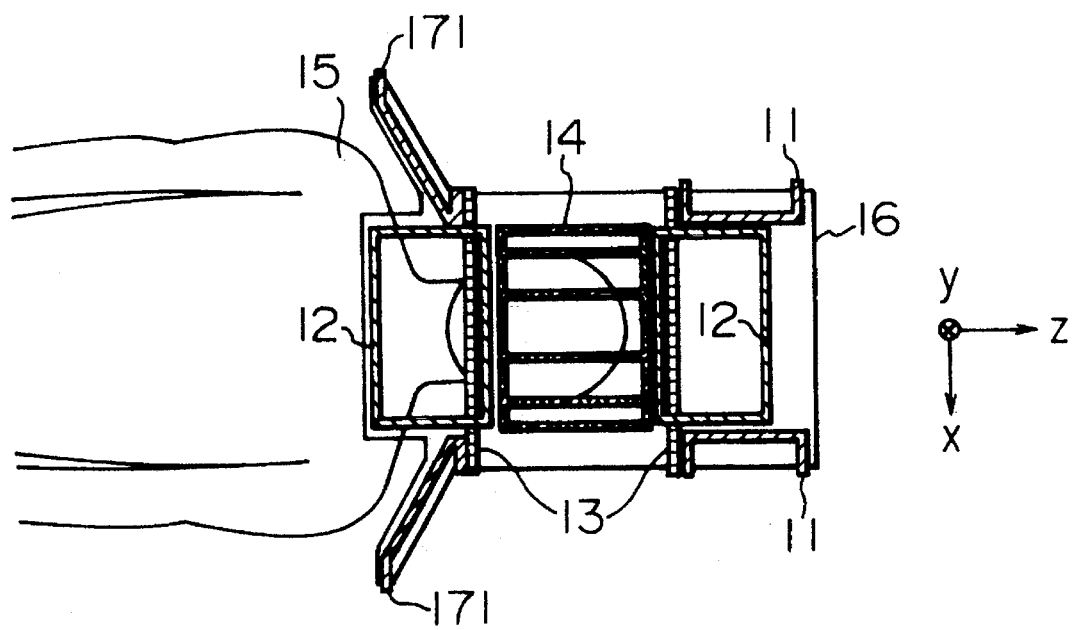
FIGS. 27A and 27B are front views of a local gradient coil according to the eighth embodiment of the present invention.
Figure 27B:
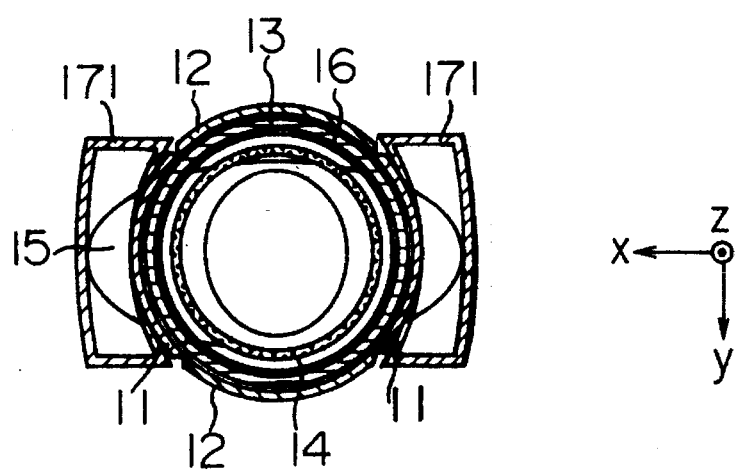

FIGS. 27A and 27B are a plane view and a front view each showing the local gradient coil according to the eighth embodiment of the present invention. FIG. 27A is a plane view when the local gradient coil is viewed in the y direction and FIG. 27B is a front view when the local gradient coil is viewed from the z direction. A set of x-direction gradient coils 171 in the proximity of the human shoulders are disposed at such an angle as not to come into contact with the human shoulders, and the conducting wire portion of the coil for generating the magnetic field effective for imparting a gradient to the static magnetic field can be disposed closer to the part for imaging than in the conventional example shown in FIGS. 11A and 11B. The shape of the bobbin 16 for supporting the local gradient coil in this embodiment is different from the shapes of the bobbins for supporting the local gradient coil in the fifth to seventh embodiments. In other words, the bobbin 16 in this embodiment comprises a cylindrical portion in which the coils 11, 12 and 13 are disposed, and a portion which continues this cylindrical portion and a part of which extends with a certain angle to the x direction in such a manner as to cover both shoulders of the human body (at which the coil 171 is disposed).

Incidentally, the local gradient coil shown in FIGS. 27A and 27B has an asymmetric shape with respect to the z direction, but it may be symmetric.

The present invention is not particularly limited to the embodiments given above, but can be applied to the local gradient coil disposed in such a fashion that the direction of the magnetic field generated by the coil at the coil center has an angle other than 90° with respect to the direction of the static magnetic field, as at least one set of coils among the gradient field coils in the x or y direction in the MRI apparatus, and the conducting wire portion of the coil for generating the magnetic field effective for imparting a gradient to the static magnetic field can be disposed in the proximity of the part for imaging in the same way as in the foregoing embodiments.

The present invention may be summarized as follows.

The present invention relates to an inspection apparatus utilizing magnetic resonance for reducing an eddy current generated with the time change of gradient magnetic fields. The apparatus according to the present invention generates locally the gradient magnetic fields, completely separates a movable main gradient coil (second gradient magnetic field) from a gradient coil for correction (first gradient magnetic field) fixed to a magnet for generating a static magnetic field, and allows the main gradient coil to move in the direction of the static magnetic field (z direction). The intensities of the gradient magnetic fields, which are generated by the first and second gradient coils at their center, per unit current, are greatly different from each other. As a result, the gradient magnetic field which is substantially generated as their difference becomes great, and current-to-magnetic field transformation efficiency becomes high. Because only the main gradient magnetic field is moved, the weight of the support mechanism can be reduced, too. The correction quantity of the eddy current is proportional to the intensity of the magnetic field generated by the main gradient coil and to the time change ratio, and the correction effect can be made uniform inside the inspection space by bringing the centers of both gradient magnetic fields into conformity with each other. As a result, high image quality can be obtained in ultra-high speed imaging.

A supplementary explanation will be given more concretely. A coil for generating the magnetic field the direction of which lies in the z direction at the coil center is used for the coil for generating the local gradient magnetic fields in the x and y directions. The local gradient coil in the x and y directions is so disposed as to avoid the human shoulders, and the conducting wire portion as a part of the local gradient coil in the x and y directions is brought closer to the imaging part than in the conventional apparatus. In other words, at least one of the coils of the local gradient coils for two-axes direction other than the direction of the static magnetic field among the three-axes direction is disposed in such a fashion that the direction of the magnetic field generated by the coil at the coil center has an angle other than 90° with respect to the direction of the static magnetic field. According to such a construction, consumed power necessary for driving the local gradient coil can be minimized and the eddy current can be reduced, too.

We claim:

1. An inspection apparatus using magnetic resonance, comprising:

magnetic field generation means for generating a static magnetic field, a gradient magnetic field and a radio frequency (RF) magnetic field, respectively;

signal detection means for detecting magnetic resonance signals from an inspected object;

a computer for executing arithmetic operations for detection signals from said signal detection means; and output means for outputting the result of the operations by said computer;

wherein said gradient magnetic field generation means comprises a first set of gradient coils and a second set of gradient coils;

said first set of gradient coils is fixed to a magnet directly or indirectly for generating said static magnetic field;

said second set of gradient coils is movable; and the magnetic field generated by said second set of gradient coils at a conducting portion of said magnet is offset by the magnetic field generated by said first set of gradient coils.

2. An inspection apparatus using magnetic resonance according to claim 1, wherein the gradient magnetic field generated by said first set of gradient coils in the proximity of the center of said magnet is smaller than the gradient magnetic field generated by said second set of gradient coils.

3. An inspection apparatus using magnetic resonance according to claim 1, wherein the center of the gradient magnetic field generated by said first set of gradient coils is in conformity with the center of the gradient magnetic field generated by said second set of gradient coils.

4. An inspection apparatus using magnetic resonance according to claim 1, wherein said second set of gradient coils is movable in the direction of said static magnetic field generated by said magnet.

5. An inspection apparatus using magnetic resonance according to claim 1, wherein at least one of said first set of gradient coils and second set of gradient coils comprises a plurality of coils having mutually different shapes and substantially balances the torques received from said static magnetic field.

6. An inspection apparatus using magnetic resonance, comprising:

magnetic field generation means for generating a static magnetic field, a gradient magnetic field and a radio frequency (RF) magnetic field, respectively;

signal detection means for detecting magnetic resonance signals from an inspected object;

a computer for executing arithmetic operations for detection signals from said signal detection means; and output means for outputting the result of the operations by said computer;

wherein said gradient magnetic field generation means comprises a first set of gradient coils and a second set of gradient coils;

said first set of gradient coils is fixed to a magnet for generating said static magnetic field;

said second set of gradient coils is movable;

the gradient magnetic field generated by said first set of gradient coils in the proximity of the center of said magnet is smaller than the gradient magnetic field generated by said second set of gradient coils; and the magnetic field generated by said second set of gradient coils at a conducting portion of said magnet is offset by the magnetic field generated by said first set of gradient coils.

7. An inspection apparatus using magnetic resonance, according to claim 6, wherein said second set of gradient coils is movable in the direction of said static magnetic field generated by said magnet.

8. An inspection apparatus using magnetic resonance, according to claim 6, wherein at least one of said first set of gradient coils and second set of gradient coils comprises a plurality of coils having mutually different shapes, and substantially balances the torques received from said static magnetic field.

9. An inspection apparatus using magnetic resonance, comprising:

magnetic field generation means for generating a static magnetic field, a gradient magnetic field and a radio frequency (RF) magnetic field, respectively;

signal detection means for detecting magnetic resonance signal from an inspected object;

a computer for executing arithmetic operations for detection signals from said signal detection means; and output means for outputting the result of the operations of said computer;

wherein said gradient magnetic field generation means comprises a first set of gradient coils and a second set of gradient coils;

said first set of gradient coils is fixed to a magnet for generating said static magnetic field;

said second set of gradient coils is movable;

the center of the gradient magnetic field generated by said first set of gradient coils is in conformity with the center of the magnetic field generated by said second set of gradient coils;

the gradient magnetic field generated by said first set of gradient coils in the proximity of the center of said magnet is smaller than the gradient magnetic field generated by said second set of gradient coils; and the magnetic field generated by said second set of gradient coils at a conducting portion of said magnet is offset by the magnetic field generated by said first set of gradient coils.

10. An inspection apparatus using magnetic resonance, according to claim 9, wherein said second set of gradient coils is movable in the direction of said static magnetic field generated by said magnet.

11. An inspection apparatus using magnetic resonance, according to claim 9, wherein at least one of said first set of gradient coils and second set of gradient coils comprises a plurality of coils having mutually different shapes, and substantially balances the torques received from said static magnetic field.

12. An inspection apparatus using magnetic resonance, comprising:

magnetic field generation means for generating a static magnetic field, a gradient magnetic field and a radio frequency (RF) magnetic field, respectively;

signal detection means for detecting magnetic resonance signals from an inspected object;

a computer for executing arithmetic operations for detection signals from said signal detection means; and output means for outputting the result of the operations by said computer;

wherein said gradient magnetic field generation means comprises a first set of gradient coils, a second set of gradient coils and a third set of gradient coils;

said first set of gradient coils and third set of gradient coils are fixed to a magnet for generating said static magnetic field;

said second set of gradient coils is movable; and the magnetic field generated by said second set of gradient coils at a conducting portion of said magnet is offset by the magnetic field generated by said first set of gradient coils.

13. An inspection apparatus using magnetic resonance, according to claim 12, wherein said second set of gradient coils is movable in the direction of said static magnetic field generated by said magnet.

14. An inspection apparatus using magnetic resonance, according to claim 12, wherein said third set of gradient coils is a set of self-shielded type gradient coils and comprises two sets of gradient coils, and said first set of gradient coils is interposed between said two sets of coils constituting said third set of gradient coils.

15. An inspection apparatus using magnetic resonance, according to claim 12, wherein when said first set of gradient coils, said second set of gradient coils and said third set of gradient coils are driven, a current source for driving said first set of gradient coils and said second set of gradient coils is the same as a current source for driving said third set of gradient coils except that time constants of circuits for shaping the waveforms of the currents are different.

16. An inspection apparatus using magnetic resonance, according to claim 12, wherein when said first set of gradient coils, said second set of gradient coils and said third set of gradient coils are driven, said first set of gradient coils and said second set of gradient coils are driven by the same current source.

17. An inspection apparatus using magnetic resonance, according to claim 16, wherein when said first set of gradient coils, said second set of gradient coils and said third set of gradient coils are driven, a current source for driving said first set of gradient coils and said second set of gradient coils is the same as a current source for driving said third set of gradient coils except that time constants of circuits for shaping the waveforms of the currents are different.

18. An inspection apparatus using nuclear magnetic resonance, comprising:

a magnet for generating a static magnetic field;

a cylindrical inside space disposed inside said magnet and accommodating an inspected object;

a gradient coil disposed inside said magnet and comprising a plurality of coils for generating a gradient magnetic field in said inside space;

a radio frequency (RF) probe for transmitting and receiving an RF magnetic field to and from said inspected object; and a local gradient coil for imaging a local part of said inspected object, disposed in the proximity of said local part, generating a local gradient magnetic field, and smaller than said gradient coil;

said magnet generating said static magnetic field in an axial direction of said cylindrical inside space;

wherein, among a plurality of said coils constituting said local gradient coil, at least one of a plurality of said coils generating said local gradient magnetic field in a direction other than the direction of said static magnetic field is disposed in such a fashion that the direction of the magnetic field generated by said coil at the center thereof has an angle other than 90° with respect to the direction of said static magnetic field.

19. An inspection apparatus using nuclear magnetic resonance, according to claim 18, wherein a super-conducting magnet is used as said magnet, and among a plurality of said coils constituting said local gradient coil, at least those coils which form a pair among a plurality of said coils generating said local gradient magnetic field in a direction other than in the direction of said static magnetic field are disposed in such a fashion that the direction of the magnetic field generated by said coils at the center thereof has an angle other than 90° with respect to the direction of said static magnetic field.

20. An inspection apparatus using nuclear magnetic resonance, according to claim 18, wherein a super-conducting magnet is used as said magnet, and among a plurality of said coils constituting said local gradient coil, at least those coils which form a pair among a plurality of said coils generating said local gradient magnetic field in a direction other than in the direction of said static magnetic field are disposed in such a fashion that the direction of the magnetic field generated by said coils at the center thereof is in parallel with the direction of said static magnetic field.

21. An inspection apparatus using nuclear magnetic resonance, according to claim 20, wherein all of a plurality of said coils generating said local gradient magnetic field in a direction other than the direction of said static magnetic field among a plurality of said coils constituting said local gradient coil are disposed in such a fashion that the direction of the magnetic field generated by said coils at the center thereof are in parallel with the direction of said static magnetic field.

22. An inspection apparatus using nuclear magnetic resonance, according to claim 18, wherein rollers are disposed on a bobbin for supporting said local gradient coil, and each of said rollers is equipped with a stopper.

23. An inspection apparatus using nuclear magnetic resonance, according to claim 18, wherein a bobbin for supporting said local gradient coil is fixed to a bed for supporting said inspected object.

24. An inspection apparatus using nuclear magnetic resonance, according to claim 18, wherein position detection means for detecting the position of said local gradient coil is disposed in said inside space, and the connection of a driving power supply for driving said gradient coil is switched in accordance with the position of said local gradient coil.

25. An inspection apparatus using nuclear magnetic resonance, according to claim 18, wherein a sound absorbing material is buried into the inside of a bobbin for supporting said local gradient coil.

26. An inspection apparatus using nuclear magnetic resonance, according to claim 25, wherein said sound absorbing material is a rigid foamed material made of polynorbornene or a styrene-butadiene block copolymer.

27. A nuclear magnetic resonance imaging (MRI) apparatus comprising:

a magnet for generating a static magnetic field;

a cylindrical inside space disposed inside said magnet and accommodating an inspected object;

a gradient coil disposed inside said magnet and comprising a plurality of coils for generating a gradient magnetic field in said inside space;

a radio frequency (RF) probe for transmitting and receiving a radio frequency magnetic field to and from said inspected object; and a local gradient coil for imaging a local part of said inspected object, disposed in the proximity of said local part, generating a local gradient magnetic field, and smaller than said gradient coil;

said magnet generating said static magnetic field in an axial direction of said cylindrical inside space;

wherein said RF probe is fixed to a bobbin for supporting said local gradient coil; and among a plurality of said coils constituting said local gradient coil, at least one of a plurality of coils for generating said local gradient magnetic field in a direction other than the direction of said static magnetic field is disposed in such a fashion that the direction of the magnetic field generated by said coil at the center thereof has an angle other than 90° with respect to the direction of said static magnetic field.

28. An inspection apparatus using nuclear magnetic resonance, according to claim 27, wherein the length of said RF probe is not greater than 20 cm, and said local gradient coil is a local gradient coil for effecting brain imaging.

29. An inspection apparatus using nuclear magnetic resonance, according to claim 27, wherein an RF shield made of a metallic conductor is disposed between said RF probe and said bobbin for supporting said local gradient coil.

30. An inspection apparatus using nuclear magnetic resonance, according to claim 27, wherein position detection means for detecting the position of said local gradient coil is disposed in said inside space, and connection of a power supply for driving said gradient coil is switched in accordance with the position of said local gradient coil.

31. A nuclear magnetic resonance imaging (MRI) apparatus comprising:

a magnet for generating a static magnetic field;

a cylindrical inside space disposed in said magnet and accommodating an inspected object;

a gradient coil disposed in said magnet and comprising a plurality of coils for generating a gradient magnetic field in said inside space; and a radio frequency (RF) probe for transmitting and receiving a radio frequency magnetic field to and from said inspected object;

said magnet generating said static magnetic field in the axial direction of said cylindrical inside space;

wherein, among a plurality of said coils constituting said gradient coil, at least one of a plurality of coils generating said gradient magnetic field in a direction other than the direction of said static magnetic field is disposed in such a fashion that the direction of the magnetic field generated by said coil at the center thereof has an angle other than 90° with respect to the direction of said static magnetic field.

32. A nuclear magnetic resonance inspection (MRI) apparatus comprising:

a magnet for generating a static magnetic field;

a cylindrical inside space disposed inside said magnet and accommodating an inspected object;

a gradient coil disposed inside said magnet and comprising a plurality of coils for generating a gradient magnetic field in said inside space; and a radio frequency (RF) probe for transmitting and receiving a radio frequency magnetic field to and from said inspected object;

said magnet generating said static magnetic field in an axial direction of said cylindrical inside space;

wherein, among a plurality of said coils constituting said gradient coil, at least one of a plurality of said coils for generating said gradient magnetic field in a direction other than the direction of said static magnetic field is disposed in such a fashion that the direction of the magnetic field generated by said coil at the center thereof is substantially in parallel with the direction of said static magnetic field.

33. An inspection apparatus using magnetic resonance, comprising magnetic field generation means for generating a static magnetic field, a gradient magnetic field and a radio frequency (RF) magnetic field, respectively, said gradient magnetic field generation means including a plurality of gradient coils, wherein said plurality of gradient coils include at least one of (a) a first set of gradient coils fixed to a magnet directly or indirectly for generating said static magnetic field, and a second set of gradient coils which is movable, the magnetic field generated by said second set of gradient coils at a conducting portion of said magnet being offset by the magnetic field generated by said first set of gradient coils, and (b) at least one set of gradient coils generating a local gradient magnetic field in a direction other than a direction of said static magnetic field and being disposed so that the direction of the local gradient magnetic field generated by said at least one set of gradient coils at a center thereof has an angle other than 90° with respect to the direction of said static magnetic field.

* * * * *